(12) United States Patent
Nishihara et al.

(10) Patent No.: US 9,419,535 B2
(45) Date of Patent: Aug. 16, 2016

(54) ELECTRIC POWER CONVERTER

(75) Inventors: Atsuo Nishihara, Tokyo (JP); Ken Maeda, Hitachinaka (JP); Kinya Nakatsu, Tokyo (JP); Yukio Hattori, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 312 days.

(21) Appl. No.: 14/122,713

(22) PCT Filed: May 25, 2012

(86) PCT No.: PCT/JP2012/063516
§ 371 (c)(1),
(2), (4) Date: Nov. 27, 2013

(87) PCT Pub. No.: WO2012/165341
PCT Pub. Date: Dec. 6, 2012

(65) Prior Publication Data
US 2014/0078803 A1  Mar. 20, 2014

(30) Foreign Application Priority Data

Jun. 2, 2011 (JP) .................................. 2011-123907

(51) Int. Cl.
| | | |
|---|---|---|
| H02M 7/797 | (2006.01) | |
| H02M 7/00 | (2006.01) | |
| H05K 7/14 | (2006.01) | |
| H05K 7/20 | (2006.01) | |

(52) U.S. Cl.
CPC ............. *H02M 7/003* (2013.01); *H05K 7/1432* (2013.01); *H05K 7/20927* (2013.01); *H02M 7/797* (2013.01)

(58) Field of Classification Search
CPC ....... H02M 7/003; H02M 7/797; H02M 1/10; H02M 3/00; H02M 7/537; H05K 7/1432; H01L 23/473; H01L 25/03

USPC .................................. 363/141–147, 131–132
See application file for complete search history.

(56) References Cited

U.S. PATENT DOCUMENTS 8,193,449 B2 * 6/2012 Esmaili ................ H05K 7/1432
174/70 B
2009/0231811 A1 9/2009 Tokuyama et al.
(Continued)

FOREIGN PATENT DOCUMENTS

| EP | 2 101 402 A2 | 9/2009 | |
|---|---|---|---|
| EP | 2101402 A2 * | 9/2009 | .............. H01L 23/36 |

(Continued)

OTHER PUBLICATIONS

International Search Report (PCT/ISA/210) with English translation dated Aug. 28, 2012 (Five (5) pages).
(Continued)

*Primary Examiner* — Yemane Mehari
(74) *Attorney, Agent, or Firm* — Crowell & Moring LLP

(57) ABSTRACT

An electric power converter is provided with: a power semiconductor module, which has a power semiconductor element that converts a direct current into an alternating current; a capacitor module, which has a capacitor element that smooths the direct current; and a cooling body, which cools the power semiconductor module and the capacitor module. The capacitor module has: a case, which has an approximately rectangular shape, has an opening formed in one surface, and has a space for housing the capacitor element; and a DC conductor for electrically connecting the power semiconductor element and the capacitor element to each other. The cooling body is formed to face the bottom surface on the inner wall of the case, and both the side surfaces of the case, the side surfaces facing each other. Between the capacitor element and the inner wall surfaces of the case, the direct current conductor is formed along the bottom surface and both the side surfaces of the case.

8 Claims, 19 Drawing Sheets

(56) References Cited

U.S. PATENT DOCUMENTS

| | | |
|---|---|---|
| 2010/0089641 A1 | 4/2010 | Esmaili et al. |
| 2010/0097765 A1 | 4/2010 | Suzuki et al. |
| 2011/0051371 A1 | 3/2011 | Azuma et al. |
| 2011/0249421 A1 | 10/2011 | Matsuo et al. |

FOREIGN PATENT DOCUMENTS

| | | |
|---|---|---|
| JP | 2009-289943 A | 12/2009 |
| JP | 2010-35346 A | 2/2010 |
| JP | 2010-41838 | 2/2010 |
| JP | 2010-110065 A | 5/2010 |
| JP | 2010-110143 A | 5/2010 |
| JP | 2011-77464 A | 4/2011 |
| JP | 2011-216755 A | 10/2011 |

OTHER PUBLICATIONS

Extended European Search Report issued in counterpart European Application No. EP 12794123.5 dated Aug. 19, 2015 (Seven (7) pages).

* cited by examiner

ELECTRIC POWER CONVERTER

TECHNICAL FIELD

The present invention relates to an electric power converter, and especially relates to an on-vehicle electric power converter for an electric vehicle and a hybrid electric vehicle.

BACKGROUND ART

An electric vehicle or a hybrid electric vehicle mounts a motor as a power source of the vehicle, and is typically provided with an electric power converter such as an inverter for controlling the electric power supplied to the motor. The electric power converter includes a power module that houses a semiconductor element for electric power such as an insulated gate bipolar transistor (IGBT), a drive circuit that drives the power module, a control circuit that controls the power module and the drive circuit, and a capacitor for smoothing a current. Among them, the capacitor is a part typically has a low heat resistance temperature and is easily affected by heat. In the conventional inverter, since the heating value of a smoothing capacitor is small, that has not been that big of a problem. However, in recent years, there is a tendency that the inverter for vehicle is increased in current capacity and is decreased in size, and therefore, cooling of the smoothing capacitor becomes a problem. As an example of a structure of the capacitor for enhancing the cooling efficiency, Japanese Patent Application Laid-Open No. 2009-289943 discloses a structure to cool the capacitor with cooling water, for example.

In the smoothing capacitor, a member that generates heat is not only the capacitor element, but also an electrode bus bar that may generate large Joule heat. The bus bar is not provided with countermeasures for cooling, and cannot obtain sufficient effect, which becomes an issue.

CITATION LIST

Patent Literature

PLT 1: Japanese Patent Application Laid-Open No. 2009-289943

SUMMARY OF INVENTION

Technical Problem

The present invention has been made to solve the problems, and enhances the cooling performance of a conductor connected with a smoothing capacitor element.

In addition, the present invention provides compact implementation of a main circuit of the electric power converter that includes the capacitor and the power module.

Solution to Problem

According to a first aspect of the present invention, an electric power converter includes: a power semiconductor module including a power semiconductor element that converts a direct current into an alternating current; a capacitor module including a capacitor element that smooths the direct current; and a cooling body configured to cool the power semiconductor module and the capacitor module. The capacitor module includes a case having an approximately rectangular shape, forming an opening in one surface, and including a space for housing the capacitor element, and a DC conductor for electrically connecting the power semiconductor element and the capacitor element. The cooling body is formed to face a bottom surface of an inner wall of the case, and both side surfaces of the case, the side surfaces facing each other. The DC conductor is formed between the capacitor element and the inner wall surface of the case, and along the bottom surface and the both side surfaces of the case.

Advantageous Effects of Invention

A conductor connected with a smoothing capacitor element can be efficiently cooled, and a capacitor that smooths a large current can be implemented in a compact manner. Since the smoothing capacitor is a part that occupies a large volume inside the electric power converter, the electric power converter can be made small in size by making the smoothing capacitor compact.

DESCRIPTION OF EMBODIMENTS

Hereinafter, embodiments for implementing the present invention will be described with reference to the drawings.

Embodiment 1

Figure 1:
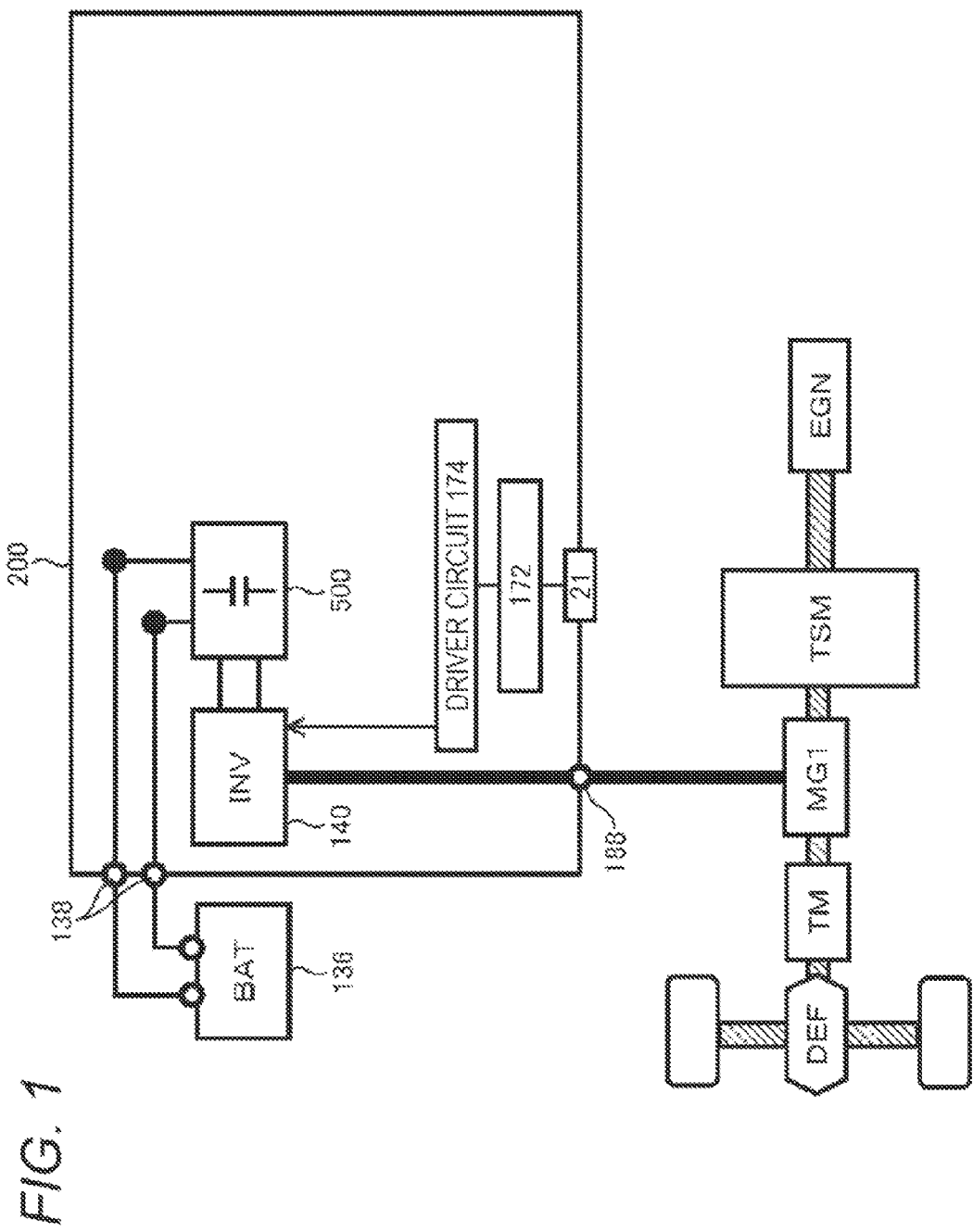
FIG. 1 is a system diagram illustrating a system of a hybrid electric vehicle.

FIG. 1 is a diagram illustrating control blocks of a hybrid electric vehicle (hereinafter referred to as "HEV"). An engine EGN and a motor generator MG1 generate torque for driving a vehicle. In addition, the motor generator MG1 has a function not only to generate rotational torque but also to convert mechanical energy applied from an outside to the motor generator MG1 into electric power.

The motor generator MG1 is, for example, a synchronous motor or an induction motor, and, as described above, works as a motor or an electric generator depending upon the operational method. When mounted on a vehicle, the motor generator MG1 is preferred to be small in size and high in power, and thus a permanent magnet type synchronous electric motor which uses a magnet such as neodymium is appropriate. In addition, a permanent magnet type synchronous electric motor is excellent for a vehicle also because its rotor generates less heat than that of an induction electric motor.

Output torque on the output side of the engine EGN is transmitted to the motor generator MG1 through a power distribution mechanism TSM. Rotational torque from the power distribution mechanism TSM or rotational torque generated by the motor generator MG1 is transmitted to wheels through a transmission TM and a differential gear DEF. In a regenerative braking operation, on the other hand, rotational torque is transmitted from the wheels to the motor generator MG1. The motor generator MG1 generates AC power based upon the rotational torque supplied from the wheels. The generated AC power is, as described later, converted into DC power by the electric power converter 200 and charges a high-voltage battery 136. The electric power charged at the battery 136 is used again as travel energy.

Next, the electric power converter 200 will be explained. The inverter circuit 140 is electrically connected with the battery 136 through a DC connector 138. Electric power is transferred between the battery 136 and the inverter circuit 140. When the motor generator MG1 operates as a motor, the inverter circuit 140 generates AC power based upon DC power supplied from the battery 136 through the DC connector 138 and supplies it to the motor generator MG1 through an AC connector 188. The structure constituted with the motor generator MG1 and the inverter circuit 140 operates as a first electric motor generator unit.

Note that, in the present embodiment, the first electric motor generator unit operates on electric power of the battery 136 as an electric motor unit so as to drive the vehicle only on power of the motor generator MG1. In addition, in the present embodiment, the first electric motor generator unit operates as a power generation unit on power of an engine EGN or power from the wheels so as to generate electric power, thereby charging the battery 136.

Note that the electric power converter 200 includes a capacitor module 500 for smoothing the DC power supplied to the inverter circuit 140.

The electric power converter 200 includes a communication connector 21 for receiving an instruction from a higher-order control device or transmitting data indicating a status to the higher-order control device. In the electric power converter 200, a control circuit 172 calculates a control amount of the motor generator MG1 based upon an instruction to be input from the connector 21 and in addition calculates whether to operate as a motor or to operate as an electric generator. Based upon those calculation results, the control circuit 172 generates control pulses and supplies the control pulses to a driver circuit 174. Based upon the supplied control pulses, the driver circuit 174 generates drive pulses for controlling the inverter circuit 140.

Figure 2:
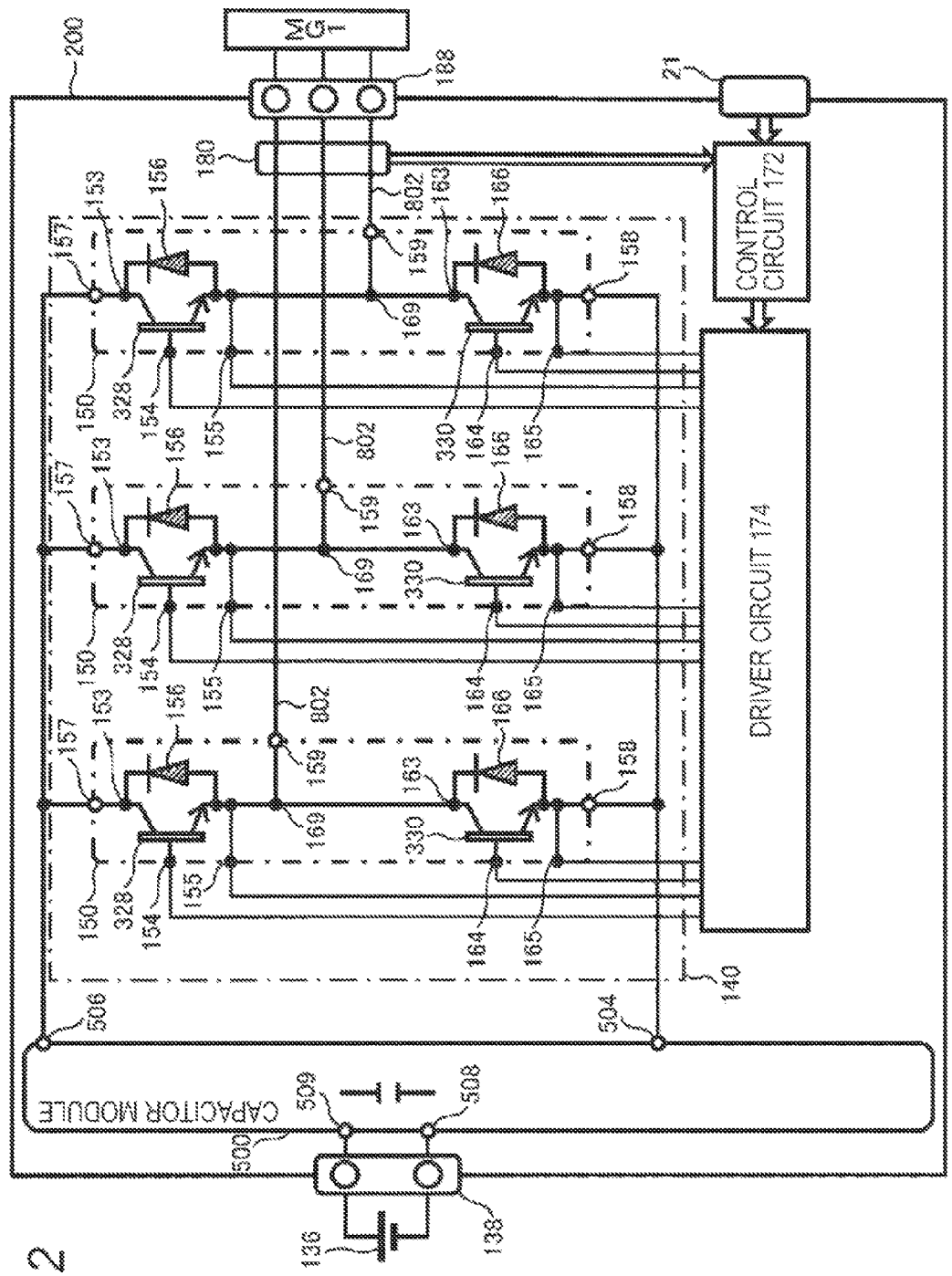
FIG. 2 is a circuit diagram illustrating a structure of an electrical circuit illustrated in FIG. 1.

Next, the structure of the electrical circuit of the inverter circuit 140 will be explained with reference to FIG. 2. Note that, in the following example, an insulated gate bipolar transistor is used as a semiconductor element, which is, hereinafter, abbreviated to an IGBT. A series circuit 150 of upper and lower arms is constituted with an IGBT 328 and a diode 156, which operate as the upper arm, and an IGBT 330 and a diode 166, which operate as the lower arm. The inverter circuit 140 includes this series circuit 150 corresponding to each of three phases, that is, a U phase, a V phase, and a W phase, of the AC power to be output.

In this embodiment, these three phases correspond to each phase winding of the three phases of an armature winding of the motor generator MG1. The series circuit 150 of upper and lower arms of each of the three phases outputs an alternating current from an intermediate electrode 169, which is the midpoint of the series circuit. This intermediate electrode 169 is connected through an AC connector 159 and an AC terminal 188 with AC bus bars 802 and 804 to be described below, which are AC power lines to the motor generator MG1.

A collector electrode 153 of the IGBT 328 of the upper arm is electrically connected through a positive terminal 157 to a capacitor terminal 506 on the positive electrode side of the capacitor module 500. In addition, an emitter electrode of the IGBT 330 of the lower arm is electrically connected through a negative terminal 158 to a capacitor terminal 504 on the negative electrode side of the capacitor module 500.

As described above, the control circuit 172 receives a control instruction from the higher-order control device through the connector 21. Then, based upon this, the control circuit 172 generates the control pulses, which are control signals for controlling the IGBT 328 and the IGBT 330 constituting the upper arm or the lower arm of the series circuit 150 of each of the phases constituting the inverter circuit 140, and supplies the control pulses to the driver circuit 174.

The driver circuit 174, based upon the above control pulses, supplies the drive pulses for controlling the IGBT 328 and the IGBT 330 constituting the upper arm or the lower arm of the series circuit 150 of each of the phases to the IGBT 328 and the IGBT 330 of each of the phases. The IGBT 328 and the IGBT 330, based upon the drive pulses from the driver circuit 174, carry out a conduction or interruption operation to convert the DC power supplied from the battery 136 into three-phase AC power. This converted electric power is supplied to the motor generator MG1.

The IGBT 328 includes the collector electrode 153, an emitter electrode 155 for signals, and a gate electrode 154. The IGBT 330 includes the collector electrode 163, an emitter electrode 165 for signals, and a gate electrode 164. The diode 156 is electrically connected between the collector electrode 153 and the emitter electrode 155. The diode 166 is electrically connected between the collector electrode 163 and the emitter electrode 165.

A metal-oxide semiconductor field-effect transistor (hereinafter abbreviated to MOSFET) may be used as a power semiconductor element for switching. In this case, the diode 156 and the diode 166 become unnecessary. As a power semiconductor element for switching, an IGBT is suitable for relatively high DC voltage and a MOSFET is suitable for relatively low DC voltage.

The capacitor module 500 includes the positive electrode-side capacitor terminal 506, the negative electrode-side capacitor terminal 504, a positive electrode-side power supply terminal 509, and a negative electrode-side power supply terminal 508. High-voltage DC power is supplied from the battery 136 through the DC connector 138 to the positive electrode-side power supply terminal 509 and the negative electrode-side power supply terminal 508, and then supplied from the positive electrode-side capacitor terminal 506 and the negative electrode-side capacitor terminal 504 of the capacitor module 500 to the inverter circuit 140.

On the other hand, the DC power having been converted from AC power by the inverter circuit 140 is supplied from the positive electrode-side capacitor terminal 506 and the negative electrode-side capacitor terminal 504 to the capacitor module 500, supplied from the positive electrode-side power supply terminal 509 and the negative electrode-side power supply terminal 508 through the DC connector 138 to the battery 136, and then stored in the battery 136.

The control circuit 172 includes a microcomputer for performing calculation processing of switching timing of the IGBT 328 and the IGBT 330. Input information to the microcomputer includes a target torque value required to the motor generator MG1, a current value supplied from the series circuit 150 to the motor generator MG1, and a magnetic pole position of the rotor of the motor generator MG1.

The target torque value is based upon an instruction signal having been output from a higher-order control device (not illustrated). The current value is detected based upon a detection signal by a current sensor 180. The magnetic pole position is detected based upon a detection signal having been output from a rotating magnetic pole sensor (not illustrated) such as a resolver provided to the motor generator MG1. While in the present embodiment, the explanation is made on an example in which the current sensor 180 detects current values for three phases, the current sensor 180 may be arranged to detect current values for two phases and obtains currents for three phases on calculation.

The microcomputer in the control circuit 172 calculates current instruction values of a d axis and a q axis of the motor generator MG1 based upon the target torque value, calculates voltage instruction values of the d axis and the q axis based upon differences between the calculated current instruction values of the d axis and the q axis and the detected current values of the d axis and the q axis, and then converts the calculated voltage instruction values of the d axis and the q axis into voltage instruction values of the U phase, the V phase, and the W phase based upon the detected magnetic pole position. Then, the microcomputer generates a pulse-like modulated wave based upon comparison between a fundamental wave (sine wave), which is based upon the voltage instruction values of the U phase, the V phase, and the W phase, and a carrier wave (triangle wave), and then outputs this generated modulated wave to the driver circuit 174 as a PWM (pulse width modulation) signal.

When driving the lower arm, the driver circuit 174 outputs a drive signal, which is an amplified PWM signal, to the gate electrode of the IGBT 330 of the corresponding lower arm. When driving the upper arm, the driver circuit 174 shifts the reference potential level of the PWM signal to the reference potential level of the upper arm, amplifies the PWM signal, and then outputs it as a drive signal to the gate electrode of the IGBT 328 of the corresponding upper arm.

In addition, the microcomputer in the control circuit 172 performs abnormality detection (over current, over voltage, over temperature, and the like) so as to protect the series circuit 150. For this purpose, sensing information has been input to the control circuit 172. For example, information of current flowing through the emitter electrode of each of the IGBT 328 and the IGBT 330 is input from the emitter electrode 155 for signals and the emitter electrode 165 for signals of each of the arms to a corresponding drive unit (IC). This causes each of the drive units (IC) to perform over current detection and, if over current is detected, to stop switching operations of the corresponding IGBT 328 and IGBT 330 and protect the corresponding IGBT 328 and IGBT 330 from the over current.

Information of temperature of the series circuit 150 is input from a temperature sensor (not illustrated) provided to the series circuit 150 to the microcomputer. In addition, information of DC positive electrode-side voltage at the series circuit 150 is input to the microcomputer. Based upon those pieces of information, the microcomputer performs over temperature detection and over voltage detection and, if over temperature or over voltage is detected, stops all the switching operations of the IGBT 328 and the IGBT 330.

Figure 3:
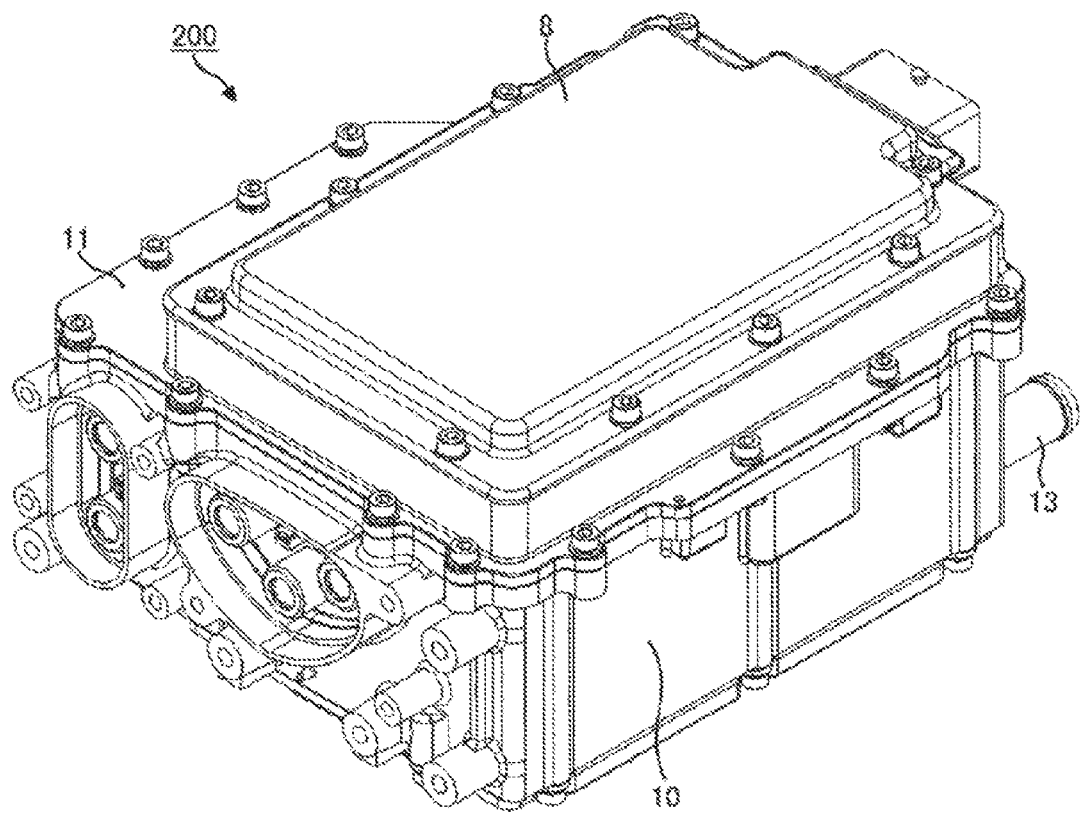
FIG. 3 is a perspective view of an appearance of an electric power converter 200.
Figure 4:
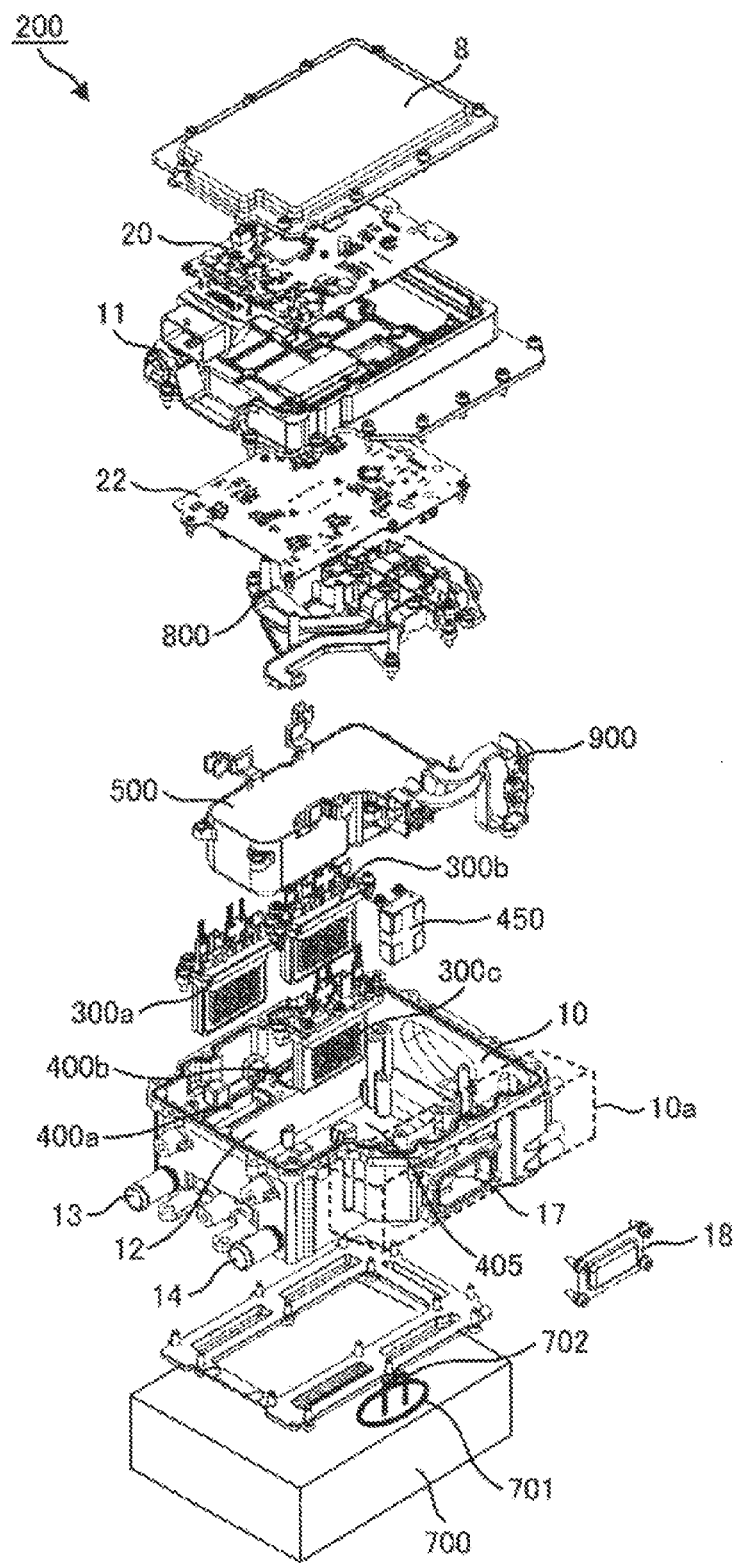
FIG. 4 is a perspective view of an exploded electric power converter 200.

FIG. 3 is an external perspective view of the electric power converter 200. FIG. 4 is a perspective view of an electric power converter 200 exploded for easy understanding, which describes an inside structure of the case 10 of the electric power converter 200.

Figure 5:
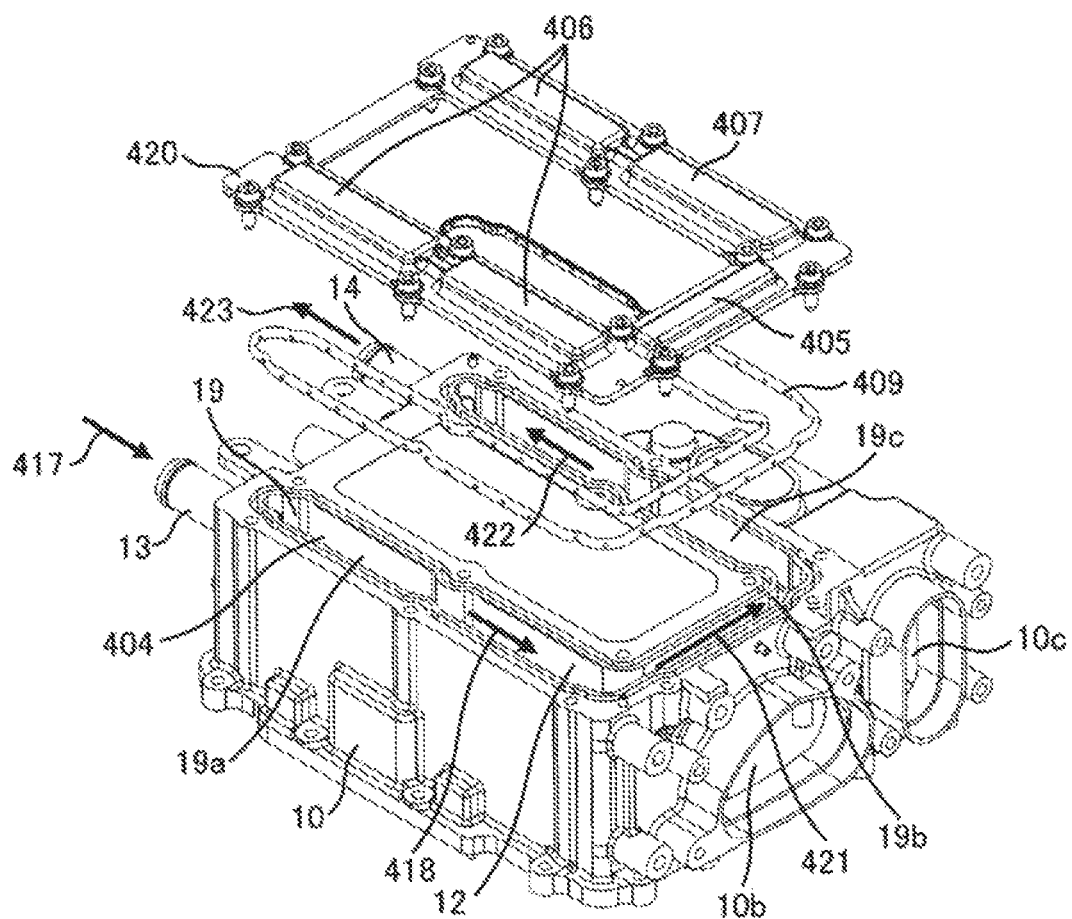
FIG. 5 is a diagram of a case 10 illustrated in FIG. 4 when viewed from below.

An inlet piping 13 for allowing a coolant to flow in and an outlet piping 14 for allowing the coolant to flow out are arranged on the same side surface of the case 10. The case 10 houses a flow channel forming body 12 such that a coolant flow channel 19 illustrated in FIG. 5 is arranged along both sides of the case 10. An opening 400a and an opening 400b are formed in an upper surface of one side of the flow channel forming body 12 along a side surface of the case 10, and an opening 400c is formed in an upper surface of another side of the flow channel forming body 12. The openings 400a to 400c are closed by the inserted power semiconductor module 300a to 300c.

A space 405 for housing the capacitor module 500 is formed between a first flow channel section 19a and the other second flow channel section 19c formed by the flow channel forming body 12, and the capacitor module 500 is housed in the space 405. This enables the coolant flowing in the coolant flow channel 19 to cool the capacitor module 500. The capacitor module 500 is arranged to be surrounded by the coolant flow channels 19a to 19c, as illustrated in FIG. 5, and is therefore efficiently cooled.

In addition, since the flow channels are formed along outer side surfaces of the capacitor module 500, the flow channels, the capacitor module 500, and the power semiconductor module 300 are orderly arranged, and the entire size becomes smaller. In addition, the coolant flow channels 19a and 19c are arranged along a long side of the capacitor module 500, and the distance between the power semiconductor modules 300 and 301, which are inserted and fixed to the coolant flow channel 19, becomes approximately constant. Therefore, a circuit constant of the smoothing capacitor and a power semiconductor module circuit becomes easily balanced in each phase of the three phases, and the circuit structure can easily reduce a spike voltage. In the present embodiment, as the coolant, water is the most suitable. However, a coolant other than water can be used. Therefore, hereinafter, the "coolant" is used.

A bus bar assembly 800 described below is arranged above the capacitor module 500. The bus bar assembly 800 includes an AC bus bar 186 and a holding member 803 that holds the AC bus bar 186 (see FIG. 13), and holds the current sensor 180.

The coolant flow channel 19 has an effect to increase the mechanical strength in addition to the cooling effect by integrally making the flow channel forming body 12 and the case 10 by die-casting using an aluminum material. In addition, by making them with the aluminum die-casting, the flow channel forming body 12 and the case 10 become to have an integral structure, the thermal conduction of the entire electric power converter 200 is enhanced and the cooling efficiency is improved.

A driver circuit substrate 22 is arranged above the bus bar assembly 800. Further, a metal base plate 11 is arranged between the driver circuit substrate 22 and the control circuit substrate 20.

The metal base plate 11 is fixed to the case 10. The metal base plate 11 has a function of electromagnetic shield for circuit groups mounted on the driver circuit substrate 22 and the control circuit substrate 20, and a function to release the heat generated by the driver circuit substrate 22 and the control circuit substrate 20 and to cool them. A high noise suppression function of the metal base plate 11 will be described below.

Further, the metal base plate 11 has a function to increase a mechanical resonance frequency of the control circuit substrate 20. That is, it becomes possible to arrange screw fastening parts used for fixing the control circuit substrate 20 to the metal base plate 11 at short intervals, and the distance between support points when mechanical vibration is generated can be shortened, whereby a resonance frequency can be increased. Since the resonance frequency of the control circuit substrate 20 can be increased with respect to the vibration frequency transmitted from the engine and the like, the device is less likely to be affected by vibration and the reliability is improved.

A cover 8 is fixed to the metal base plate 11 and protects the control circuit substrate 20 from an electromagnetic noise from an outside.

In the case 10 according to the present embodiment, a portion in which the flow channel forming body 12 is housed has an approximately rectangular shape, and a protruding housing section 10a is formed from one side surface side of the case 10. In the protruding housing section 10a, a terminal 702 extending from a DCDC converter 700, a DC-side bus bar assembly 800 described below, and a resistor 450 are housed. Here, the resistor 450 is a resistance element for discharging electric charges stored in a capacitor element of the capacitor module 500. The electrical circuit parts between the battery 136 and the capacitor module 500 are put together in the protruding housing section 10a in this way, thereby to suppress complication of wiring and to contribute to reduction in size of the entire device.

Note that a cover 18 is a member to close a work window 17 connecting the terminal 702 extending from the DCDC converter 700. Note that the DCDC converter 700 forms an opening 701 in a surface facing a bottom surface of the case 10 for allowing the terminal 702 to pass through.

In this way, it is structured such that the flow channel forming body 12 is arranged on the bottom part of the electric power converter 200, and work for fixing necessary parts including the capacitor module 500, the bus bar assembly 800, the substrate, and the like can be sequentially performed from above. Therefore, the productivity and the reliability can be improved.

FIG. 5 is a diagram for describing the case 10 and the flow channel forming body 12, and is a diagram of the case 10 illustrated in FIG. 4 when viewed from below.

One continuous opening 404 is formed in a lower surface of the case 10, and the opening 404 is closed by the lower cover 420. A seal member 409 is provided between the lower cover 420 and the case 10 and keeps airtightness.

A projected section 406 that protrudes toward a direction opposite to the side where the coolant flow channel 19 is arranged is formed in the lower cover 420. The projected section 406 is provided corresponding to the power semiconductor modules 300a to 300c. Note that the projected section 407 does not correspond to the power semiconductor module, but is provided for adjusting a cross section area of the coolant flow channel 19.

The coolant flows in a flow direction 417 illustrated by the line through the inlet piping 13 in the first flow channel section 19a formed along the longitudinal direction of the case 10 and in a flow direction 418. Further, the coolant flows in a second flow channel section 19b formed along the lateral direction of the case 10 in a flow direction 421. The second flow channel section 19b forms a turning back flow channel. Further, the coolant flows in a third flow channel section 19c formed along a side in the longitudinal direction of the flow channel forming body 12 in a flow direction 422. The third flow channel section 19c is provided in a position facing the first flow channel section 19a across the capacitor module 500. Further, the coolant flows out through the outlet piping 14 in a flow direction 423.

All of the first flow channel section 19a, the second flow channel section 19b, and the third flow channel section 19c are formed larger in the width direction than in the depth direction. Further, the flow channel forming body 12 is formed such that the opening 404 formed in the back surface of the case 10 and the openings 400a to 400c face each other. Therefore, the flow channel forming body 12 has a structure easily manufactured by aluminum die-casting.

Detailed structure of the power semiconductor modules 300a to 300c used in the inverter circuit 140 will be described with reference to FIGS. 6 to 10. The power semiconductor modules 300a to 300c have the same structure, and a structure of the power semiconductor module 300a will be described as a representative structure. Note that a signal terminal 325U in FIGS. 6 to 10 corresponds to the gate electrode 154 and the signal emitter electrode 155 disclosed in FIG. 2, and a signal terminal 325L corresponds to the gate electrode 164 and the emitter electrode 165 disclosed in FIG. 2. Further, a DC positive terminal 315B is the same as the positive terminal 157 disclosed in FIG. 2, and a DC negative terminal 319B is the same as the negative terminal 158 disclosed in FIG. 2. Further, an AC terminal 320B is the same as the AC terminal 159 disclosed in FIG. 2.

FIG. 6(a) is a perspective view of the power semiconductor module 300a of the present embodiment. FIG. 6(b) is a cross sectional view of the power semiconductor module 300a of the present embodiment when cut by across section D and viewed from a direction E.

Figure 6:
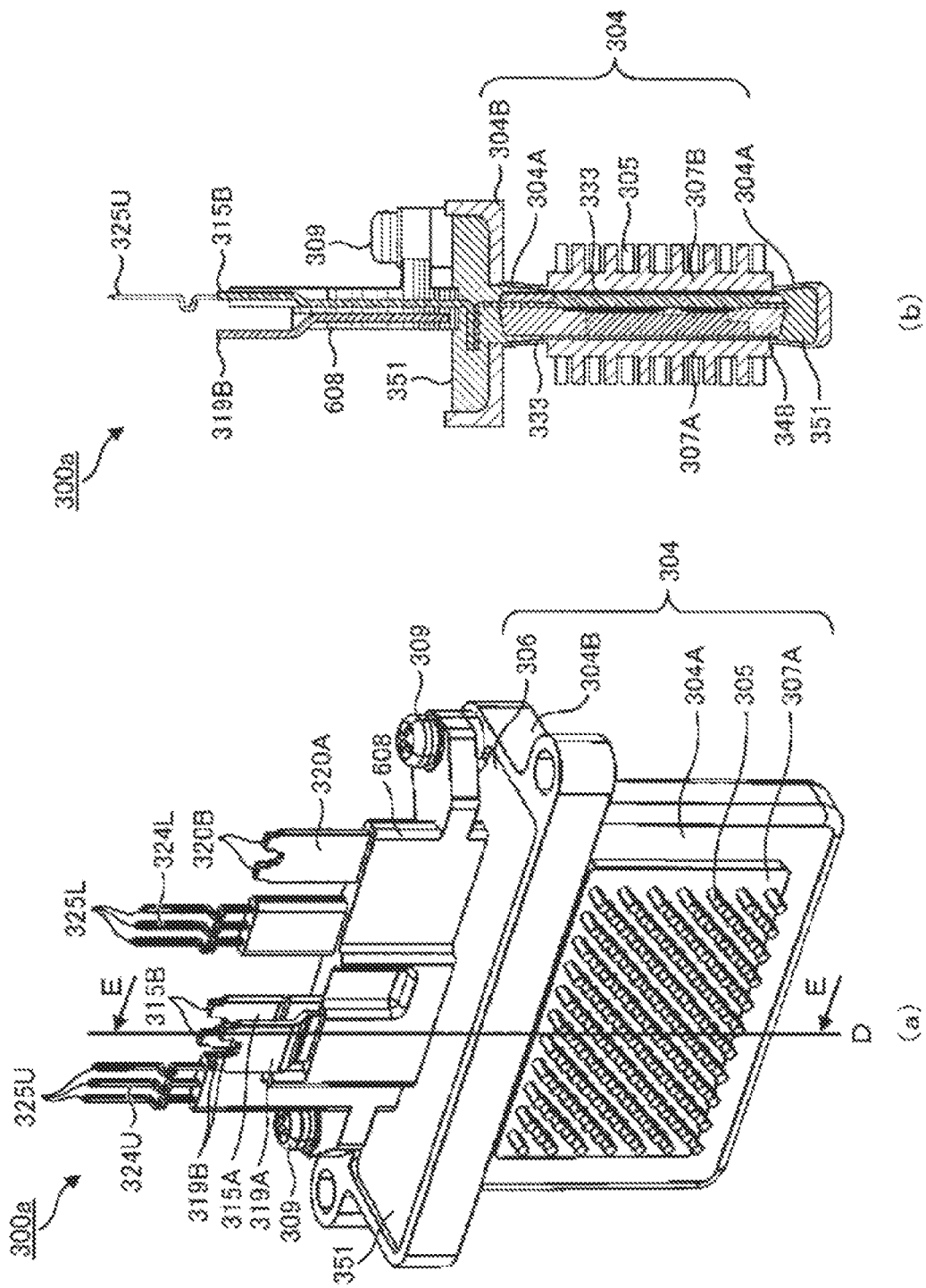
FIG. 6(*a*) is a perspective view of a power semiconductor module 300*a* of the present embodiment and FIG. 6(*b*) is a cross sectional view of the power semiconductor module 300*a* of the present embodiment when cut by a cross section D and viewed from a direction E.

FIGS. 7(a) to 7(c) are diagrams illustrating the power semiconductor module 300a in a state in which a screw 309 and a second sealing resin 351 are removed from a state illustrated in FIG. 6, for easy understanding. FIG. 7(a) is a perspective view, and FIG. 7(b) is a cross sectional view as cut when the cross section D and viewed from the direction E, similarly to FIG. 6(b). Further, FIG. 7(c) is a cross sectional view of the power semiconductor module 300a in a state before a fin 305 is pressurized and a curved portion 304A is deformed.

Figure 7:
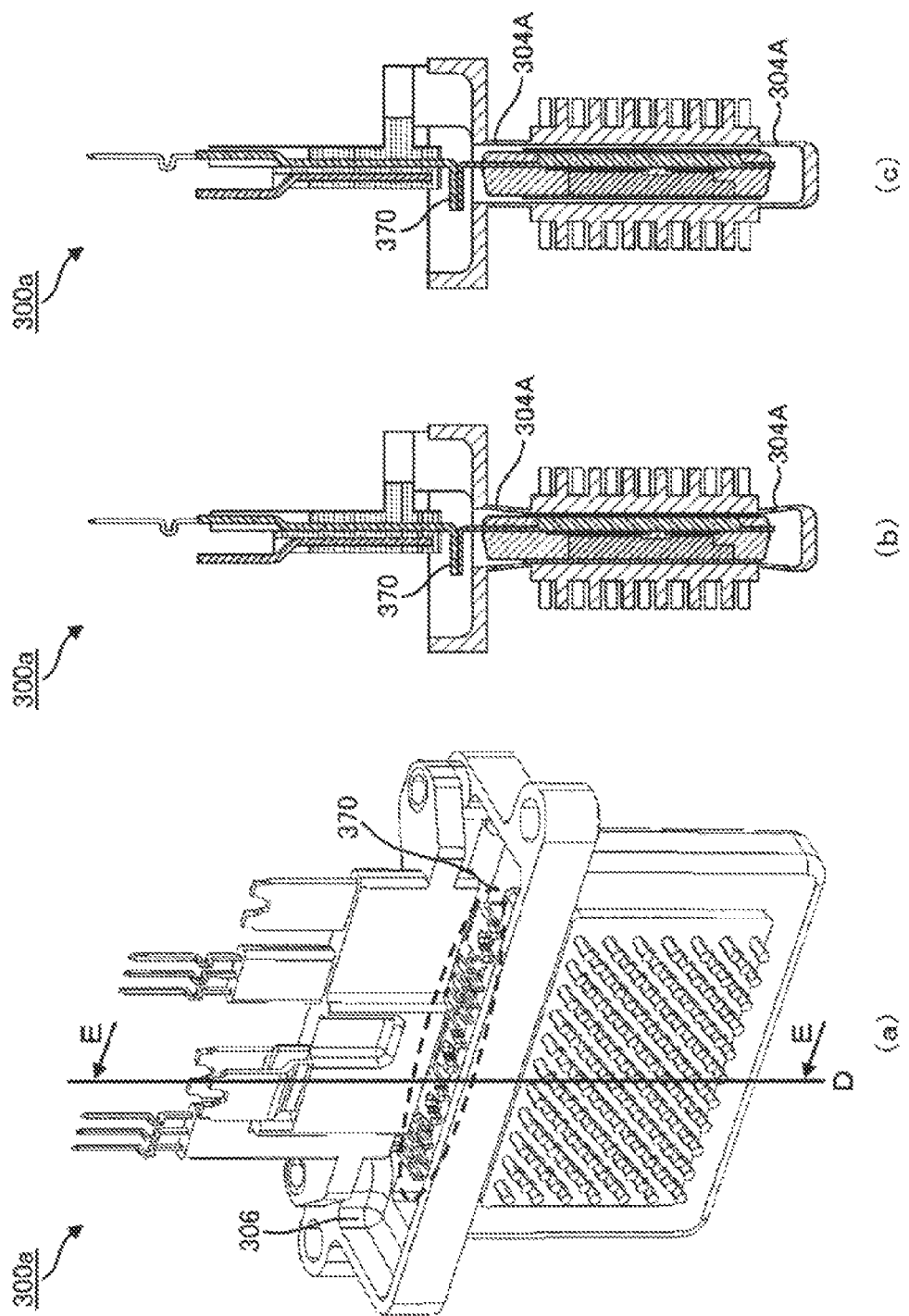
FIGS. 7(*a*) to 7(C) are diagrams illustrating the power semiconductor module 300*a* in a state in which a screw 309 and a second sealing resin 351 are removed from a state illustrated in FIG. 6, FIG. 7(*a*) is a perspective view, and FIG. 7(*b*) is a cross sectional view when cut by the cross section D and viewed from the direction E, similarly to FIG. 6(*b*).

FIGS. 8(a) and 8(b) are diagrams illustrating the power semiconductor module 300a in a state in which a module case 304 is further removed from a state illustrated in FIG. 7. FIG. 8(a) is a perspective view, and FIG. 8(b) is a cross sectional view when cut by the cross section D and viewed from the direction E, similarly to FIGS. 6(b) and 7(b).

Figure 8:
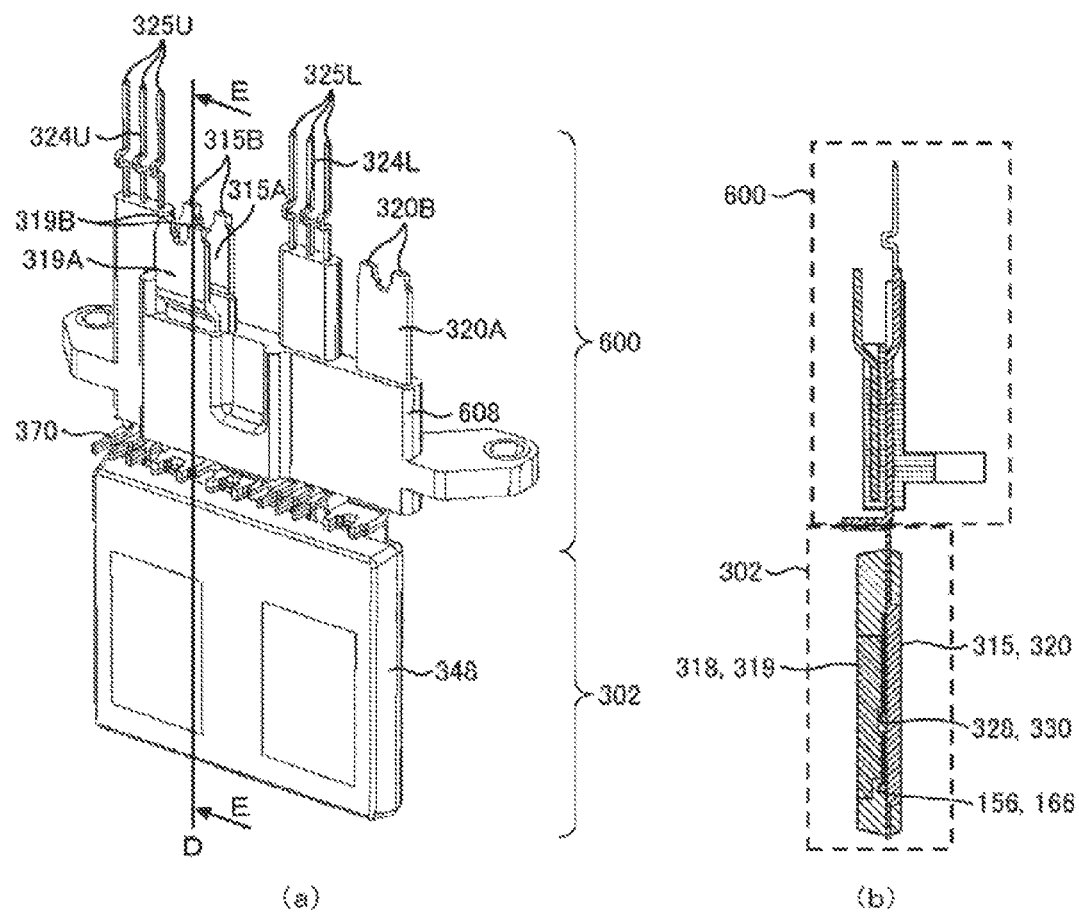
FIGS. 8(*a*) and 8(*b*) are diagrams illustrating the power semiconductor module 300*a* in a state in which a module case 304 is further removed from a state illustrated in FIG. 7, FIG. 8(*a*) is a perspective view, and FIG. 8(*b*) is a cross sectional view when cut by the cross section D and viewed from the direction E, similarly to FIGS. 6(*b*) and 7(*b*).
Figure 9:
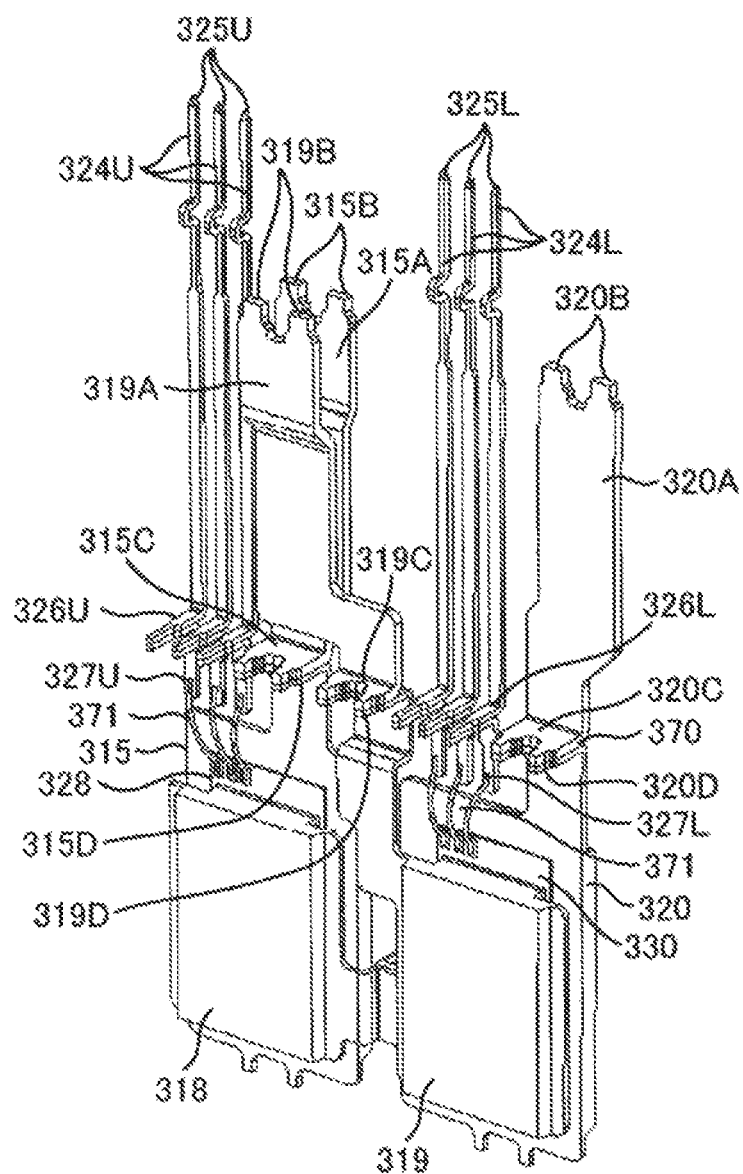
FIG. 9 is a perspective view of the power semiconductor module 300*a* in a state in which a first sealing resin 348 and a wiring insulation section 608 are further removed from a state illustrated in FIG. 8.

FIG. 9 is a perspective view of the power semiconductor module 300a in a state in which a first sealing resin 348 and a wiring insulation section 608 are further removed from a state illustrated in FIG. 8.

Figure 10:
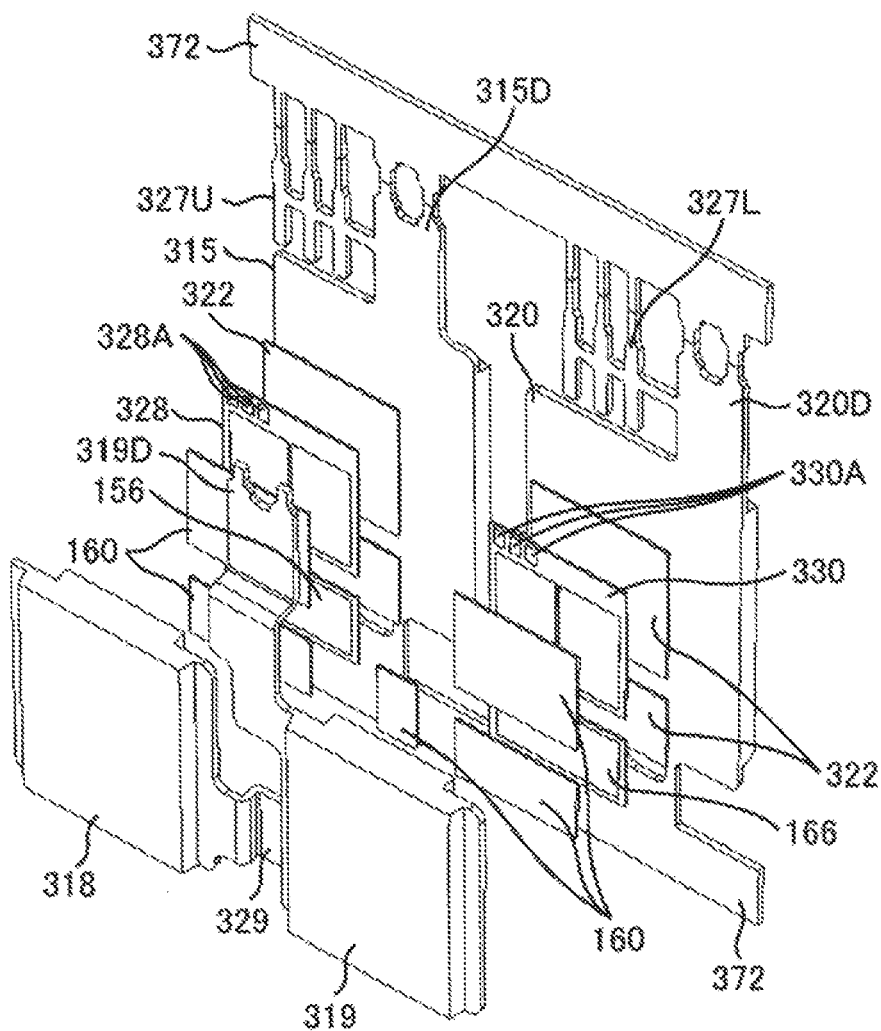
FIG. 10 is a diagram for describing an assembly process of a module primary seal body 302.

FIG. 10 is a diagram describing an assembly process of the module primary seal body 302.

The power semiconductor elements (the IGBT 328, the IGBT 330, the diode 156, and the diode 166) constituting the series circuit 150 of the upper and lower arms are, as illustrated in FIGS. 8 and 9, sandwiched from the both sides and fixed by a conductor plate 315 and a conductor plate 318 or a conductor plate 320 and a conductor plate 319. The conductor plate 315 and the like are sealed by the first sealing resin 348 in a state where their heat dissipation surfaces are exposed, and an insulation sheet 333 is thermo-compression bonded to the heat dissipation surfaces. The first sealing resin 348 is provided in a polyhedron shape (here, approximately rectangular solid shape) as illustrated in FIG. 8.

A module primary seal body 302 sealed by the first sealing resin 348 is inserted into the module case 304 and thermo-compression bonded onto the inner surface of the module case 304, which is a can-type cooler, across the insulation sheet 333. Here, the can-type cooler is a cylinder shaped cooler having an insertion slot 306 on one surface and a bottom on the other surface. An air gap remaining inside the module case 304 is filled with the second sealing resin 351.

The module case 304 is formed of an electrically conductive member such as aluminum alloy material (Al, AlSi, AlSiC, Al—C, and the like) and integrally formed seamlessly. The module case 304 has a structure not including an opening other than the insertion slot 306, and the insertion slot 306 is surrounded by a flange 304B around the outer circumference thereof. In addition, as illustrated in FIG. 6(a), a first heat dissipation surface 307A and a second heat dissipation surface 307B, which have larger surfaces than others, are arranged in a state where they face each other, and each of the power semiconductor elements (the IGBT 328, the IGBT 330, the diode 156, and the diode 166) is arranged facing these heat dissipation surfaces. The three surfaces connected to the first heat dissipation surface 307A and the second heat dissipation surface 307B, which face each other, constitute a surface sealed in a width smaller than the first heat dissipation surface 307A and the second heat dissipation surface 307B, and the insertion slot 306 is formed on the surface of the remaining one side. The module case 304 may not be provided in an accurately rectangular shape but may be round in corners as illustrated in FIG. 6(a).

Since the use of a metal case with such shape enables sealing to a coolant to be ensured at the flange 304B even if the module case 304 is inserted into the coolant flow channel 19 through which a coolant such as water or oil is flowing, the coolant is prevented by a simple structure from entering inside the module case 304. In addition, the fins 305 are formed uniformly on each of the first heat dissipation surface 307A and the second heat dissipation surface 307B, facing each other. In addition, the extremely thin curved portions 304A are formed on the outer peripheries of the first heat dissipation surface 307A and the second heat dissipation surface 307B. The curved portions 304A are made extremely thin to an extent that they are easily deformed by applying pressure to the fins 305, thereby improving the productivity after the module primary seal body 302 is inserted.

The conductor plate 315 and the like are thermo-compression bonded onto the inner wall of the module case 304 through the insulation sheet 333 as described above so as to allow the air gap between the conductor plate 315 and the like and the inner wall of the module case 304 to be reduced, thereby efficiently transmitting generated heat at the power semiconductor elements to the fins 305. In addition, the insulation sheet 333 is made thick and flexible to some extent so that the generated thermal stress is absorbed in the insulation sheet 333, and thus the power semiconductor device is excellent for use in an electric power converter for a vehicle with severe temperature changes.

A metal DC positive wiring 315A and a metal DC negative wiring 319A, which are to be electrically connected with the capacitor module 500, are provided outside the module case 304 and tip sections thereof are provided with the DC positive terminal 315B (157) and the DC negative terminal 319B (158), respectively. In addition, a metal AC wiring 320A for supplying AC power to the motor generator MG1 or MG2 is provided and its tip is provided with the AC connector 320B (159). In the present embodiment, as illustrated in FIG. 9, the DC positive wiring 315A is connected with the conductor plate 315, the DC negative wiring 319A is connected with the conductor plate 319, and the AC wiring 320A is connected with the conductor plate 320.

In addition, metal signal wirings 324U and 324L, which are to be electrically connected with the driver circuit 174, are provided outside the module case 304, their tip sections are provided with the signal terminal 325U (154, 155) and the signal terminal 325L (164, 165), respectively. In the present embodiment, as illustrated in FIG. 9, the signal wiring 324U is connected with the IGBT 328 and the signal wiring 324L is connected with the IGBT 328.

The DC positive wiring 315A, the DC negative wiring 319A, the AC wiring 320A, the signal wiring 324U, and the signal wiring 324L are integrally formed as the ancillary molded body 600 in a state where they are insulated from one another by the wiring insulation section 608 formed of a resin material. The wiring insulation section 608 also acts as a supporting member for supporting each wiring, and thus thermosetting resin or thermoplastic resin, having insulation properties, is appropriate for the resin material used for the wiring insulation section 608. This ensures insulation among the DC positive wiring 315A, the DC negative wiring 319A, the AC wiring 320A, the signal wiring 324U and the signal wiring 324L, thereby enabling high density wiring.

The ancillary molded body 600 is metallically bonded with the module primary seal body 302 at a connection section 370 before fixed to the module case 304 with the screw 309 passing through a screw hole provided on the wiring insulation section 608. The metal bonding of the module primary seal body 302 with the ancillary molded body 600 at the connection section 370 may be TIG-welded, for instance.

The DC positive wiring 315A and the DC negative wiring 319A are layered in a state where they face each other across the wiring insulation section 608, thereby constituting a shape extending substantially in parallel. Such arrangement and shape causes the instantaneous currents to flow against and in the opposite direction to each other during switching operations of the power semiconductor elements. This has an effect to cause the magnetic fields generated by the current to cancel each other out, thereby allowing reduction in inductance. Note that the AC wiring 320A and the signal terminals 325U and 325L also extend in the same direction as the DC positive wiring 315A and the DC negative wiring 319A.

The connection section 370, at which the module primary seal body 302 and the ancillary molded body 600 are metallically bonded, is sealed in the module case 304 with the second sealing resin 351. This stably ensures a necessary insulation distance between the connection section 370 and the module case 304, thereby achieving reduction in size of the power semiconductor module 300a compared to one that is not sealed.

As illustrated in FIG. 9, on the ancillary molded body 600 of the connection section 370, an ancillary molded body-side DC positive connection terminal 315C, an ancillary molded body-side DC negative connection terminal 319C, an ancillary molded body-side AC connection terminal 320C, an ancillary molded body-side signal connection terminal 326U, and an ancillary molded body-side signal connection terminal 326L are arranged in series. On the module primary seal body 302 side of the connection section 370, on the other hand, an element-side DC positive connection terminal 315D, an element-side DC negative connection terminal 319D, an element-side AC connection terminal 320D, an element-side signal connection terminal 327U, and an element-side signal connection terminal 327L are arranged in series along one surface of the first sealing resin 348 provided in a polyhedron shape. In this manner, the terminals are configured to be arranged in series at the connection section 370, thereby facilitating manufacturing of the module primary seal body 302 by transfer molding.

Here, a description will be given on the position relationship of each of the terminals with portions that extend outward from the first sealing resin 348 of the module primary seal body 302 regarded as one terminal for each type. In the explanation below, a terminal constituted with the DC positive wiring 315A (inclusive of the DC positive terminal 315B and the ancillary molded body-side DC positive connection terminal 315C) and the element-side DC positive connection terminal 315D will be referred to as a positive electrode-side terminal, a terminal constituted with the DC negative wiring 319A (inclusive of the DC negative terminal 319B and the ancillary molded body-side DC negative connection terminal 319C) and the element-side DC negative connection terminal 315D will be referred to as a negative electrode-side terminal, a terminal constituted with the AC wiring 320A (inclusive of the AC connector 320B and the ancillary molded body-side AC connection terminal 320C) and the element-side AC connection terminal 320D will be referred to as an output terminal, a terminal constituted with the signal wiring 324U (inclusive of the signal terminal 325U and the ancillary molded body-side signal connection terminal 326U) and the element-side signal connection terminal 327U will be referred to as a signal terminal for the upper arm, and a terminal constituted with the signal wiring 324L (inclusive of the signal terminal 325L and the ancillary molded body-side signal connection terminal 326L) and the element-side signal connection terminal 327L will be referred to as a signal terminal for the lower arm.

Each of the above terminals protrudes from the first sealing resin 348 and the second sealing resin 351 through the connection section 370, and the protruding portions from the first sealing resin 348 (the element-side DC positive connection terminal 315D, the element-side DC negative connection terminal 319D, the element-side AC connection terminal 320D, the element-side signal connection terminal 327U, and the element-side signal connection terminal 327L) are arranged in series along one surface of the first sealing resin 348 provided in the polyhedron shape described above. In addition, the positive electrode-side terminal and the negative electrode-side terminal protrude from the second sealing resin 351 in a layered state and extend out of the module case 304. Such configuration will prevent over stress on the connection section of the power semiconductor elements with the terminal and a gap in mold from occurring at the time of clamping when the power semiconductor elements are sealed with the first sealing resin 348 so as to manufacture the module primary seal body 302. In addition, magnetic fluxes in directions canceling each other out are generated by the currents of opposite directions flowing through the layered positive electrode-side terminal and negative electrode-side terminal, thereby achieving reduction of inductance.

On the ancillary molded body 600 side, the ancillary molded body-side DC positive connection terminal 315C and the ancillary molded body-side DC negative connection terminal 319C are formed at the tip sections of the DC positive wiring 315A and the DC negative wiring 319A on the opposite side of the DC positive terminal 315B and the DC negative terminal 319B, respectively. In addition, the ancillary molded body-side AC connection terminal 320C is formed at the tip section of the AC wiring 320A on the opposite side of the AC connector 320B. The ancillary molded body-side signal connection terminals 326U and 326L are formed at the tip sections of the signal wirings 324U and 324L on the opposite side of the signal terminals 325U and 325L, respectively.

On the module primary seal body 302 side, on the other hand, the element-side DC positive connection terminal 315D, the element-side DC negative connection terminal 319D, and the element-side AC connection terminal 320D are formed on the conductor plates 315, 319, and 320, respectively. In addition, the element-side signal connection terminals 327U and 327L are connected through a bonding wire 371 with the IGBTs 328 and 330, respectively.

As illustrated in FIG. 10, the conductor plate 315 on the DC positive electrode side, the conductor plate 320 on the AC output side, and the element-side signal connection terminals 327U and 327L are integrally processed so that they are arranged on approximately the same plane in a state where they are tied to a common tie bar 372. The collector electrode of the IGBT 328 of the upper arm side and the cathode electrode of the diode 156 of the upper arm side are fixed to the conductor plate 315. The collector electrode of the IGBT 330 of the lower arm side and the cathode electrode of the diode 166 of the lower arm side are fixed to the conductor plate 320. The conductor plate 318 and the conductor plate 319 are arranged on approximately the same plane over the IGBTs 328 and 330 and the diodes 155 and 166. The emitter electrode of the IGBT 328 of the upper arm side and the anode electrode of the diode 156 of the upper arm side are fixed to the conductor plate 318. The emitter electrode of the IGBT 330 of the lower arm side and the anode electrode of the diode 166 of the lower arm side are fixed to the conductor plate 319. Each of the power semiconductor elements is fixed through a metal bonding material 160 to an element fixing portion 322 provided on each of the conductor plates. The metal bonding material 160 is, for example, a soldering material, a silver sheet, a low-temperature sintering jointing material including fine metallic particles, or the like.

Figure 18:
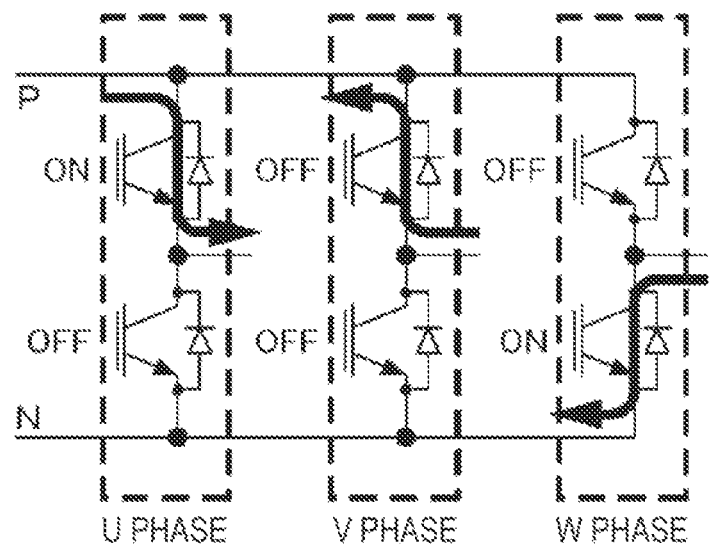
FIG. 18 is a schematic view of an inverter circuit.

Each of the power semiconductor elements has a plate-like flat structure, each of the electrodes of which is formed on the front and back surfaces. As illustrated in FIG. 10, each of the electrodes of the power semiconductor elements is sandwiched by the conductor plate 315 and the conductor plate 318 or by the conductor plate 320 and the conductor plate 319. In other words, the conductor plate 315 and the conductor plate 318 are arranged in a layered manner facing each other in approximately parallel through the IGBT 328 and the diode 156. Similarly, the conductor plate 320 and the conductor plate 319 are arranged in a layered manner facing each other in approximately parallel through the IGBT 330 and the diode 166. In addition, the conductor plate 320 and the conductor plate 318 are connected through an intermediate electrode 329. This connection causes the upper arm circuit and the lower arm circuit to be electrically connected, thereby forming an upper and lower arm series circuit. As described above, the IGBT 328 and the diode 156 are sandwiched between the conductor plate 315 and the conductor plate 318, the IGBT 330 and the diode 166 are sandwiched between the conductor plate 320 and the conductor plate 319, and the conductor plate 320 and the conductor plate 318 are connected through the intermediate electrode 329 as illustrated in FIG. 18. After that, a control electrode 328A of the IGBT 328 and the element-side signal connection terminal 327U are connected through the bonding wire 371 and a control electrode 330A of the IGBT 330 and the element-side signal connection terminal 327L are connected through the bonding wire 371.

Figure 11:
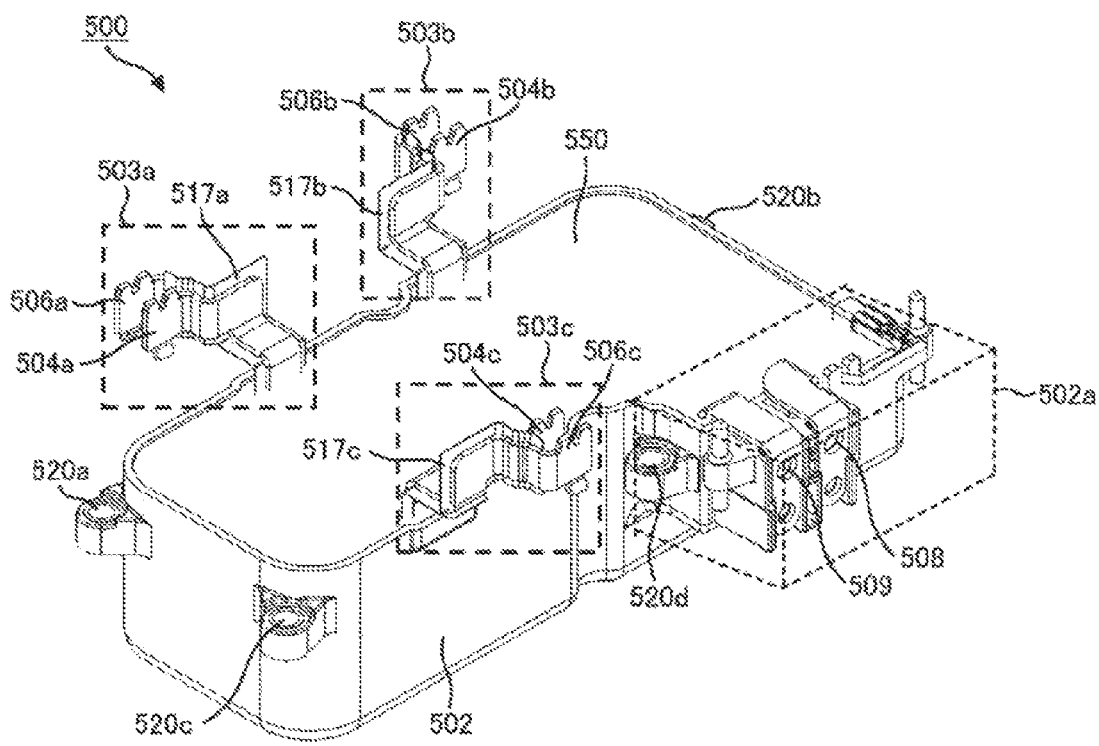
FIG. 11 is a perspective view for describing a structure of a capacitor module 500.

FIG. 11 is a perspective view for describing a structure of the capacitor module 500. Although to be described in FIG. 17, a plurality of smoothing capacitor elements that are film capacitors is provided inside the capacitor case 502, and the capacitor elements are electrically connected to a negative conductor plate 558 and a positive conductor plate 559. An insulation member for reduction in inductance is arranged between the negative conductor plate 558 and the positive conductor plate 559, and the negative conductor plate and the positive conductor plate are configured in a layered state. That is, the negative conductor plate 558 and the positive conductor plate 559 constitute a layered conductor plate.

A resin seal material 550 is filled in the capacitor case 502 for fixing the film capacitors and the layered conductor plate to the capacitor case 502. The negative electrode-side power supply terminal 508 and the positive electrode-side power supply terminal 509 are electrically connected with the layered conductor plate, protrude from an exposed surface of the resin seal material 550, and are further bent toward a side surface of the capacitor case 502. A DC power is supplied to the positive electrode-side power supply terminal 509 and the negative electrode-side power supply terminal 508 through the DC connector 138 as described in FIG. 2.

The capacitor terminals 503a to 503c are electrically connected with the layered conductor plate, and are provided corresponding to the positive terminal 157 (315B) and the negative terminal 158 (319B) of the semiconductor module 300. The capacitor terminals 503a to 503c are respectively connected with the power semiconductor modules 300a to 300c. An insulation sheet 517a is provided between the negative electrode-side capacitor terminal 504a and the positive electrode-side capacitor terminal 506a that constitute the capacitor terminal 503a and insulation is secured. The same applied to other capacitor terminals 503b to 503c.

In the capacitor case 502, fixing means for fixing the capacitor module 500 to the flow channel forming body 12, for example, holes 520a to 520d for allowing screws to pass through are provided.

Further, a protruding housing section 502a is formed on one side surface of the long-side side of the capacitor case 502. In the protruding housing section 502a, an electrical circuit element connected in series or in parallel with the film capacitors and the power supply terminals 508 and 509 is housed. In the present embodiment, a capacitor for removing a noise that removes a noise from the battery 136 and is electrically connected to the ground is housed. Since this capacitor is smaller than the film capacitors, the height of the protruding housing section 502a is formed smaller than that of the capacitor case 502. That is, a space is formed below the protruding housing section 502a. The flow channel forming body 12 illustrated in FIG. 3 forms a part of the coolant flow channel 19 in this space. This can cool the capacitor for removing a noise and can suppress local increase in the cross section area of the coolant flow channel 19, thereby preventing an increase in pressure loss.

FIG. 12(a) is a perspective view of an appearance in which the power semiconductor modules 300a to 300c, the capacitor module 500, and the bus bar assembly 800 are assembled to the case 10. FIG. 12(b) is an enlarged view of the portion A of FIG. 12(a).

The DC positive terminal 315B (157), the DC negative terminal 319B (158), the AC terminal 321 (159), and a second seal section 601B extend in the vertical direction of the case 10 toward the cover 8. The areas of current paths of the DC positive terminal 315B (157) and the DC negative terminal 319B (158) are extremely smaller than the area of the current path of the layered conductor plate in the capacitor module 500. Therefore, when the current flows from the layered conductor plate to the DC positive terminal 315B (157) and the DC negative terminal 319B (158), the areas of the current paths are drastically changed. That is, the current is concentrated in the DC positive terminal 315B (157) and the DC negative terminal 319B (158).

Therefore, in the present embodiment, the negative electrode-side capacitor terminal 504a includes a rising section 540 that rises from the layered conductor plate and a connection section 542 at a tip section of the rising section 540. In addition, the positive electrode-side capacitor terminal 506a includes a rising section 543 that rises from the layered conductor plate and a connection section 545 at a top section of the rising section 543. The DC negative terminal 319B (158) and the DC positive terminal 315B (157) of the power semiconductor module 300a are connected so as to be sandwiched by the connection section 542 and the connection section 545.

Accordingly, the negative electrode-side capacitor terminal 504a and the positive electrode-side capacitor terminal 506a have a layered structure via the insulation sheet immediately before the connection sections 542 and 545, and therefore the inductance of the wiring portions of the capacitor terminals in which the current is concentrated can be reduced. In addition, a tip of the DC negative terminal 319B (158) and a side of the connection section 542 are connected by means of welding, and similarly, a tip of the DC positive terminal 315B (157) and a side of the connection section 545 are connected by means of welding. Therefore, the productivity can be improved in addition to improvement of the characteristic by the reduction in inductance.

A tip of the AC terminal 321 (159) of the power semiconductor module 300a is connected with a tip of the AC bus bar 802a by means of welding. In a production facility for performing welding, making a welding machine movable in a plurality of directions with respect to objects to be welded leads to complication of the production facility, and is not favorable in terms of productivity and cost. Therefore, in the present embodiment, a welding portion of the AC terminal 321 (159) and a welding portion of the DC negative terminal 319B (158) are linearly arranged along a side of the longitudinal direction of the case 10. This enables a plurality of welding processes while the welding machine is moved in one direction, and improves the productivity.

Figure 12:
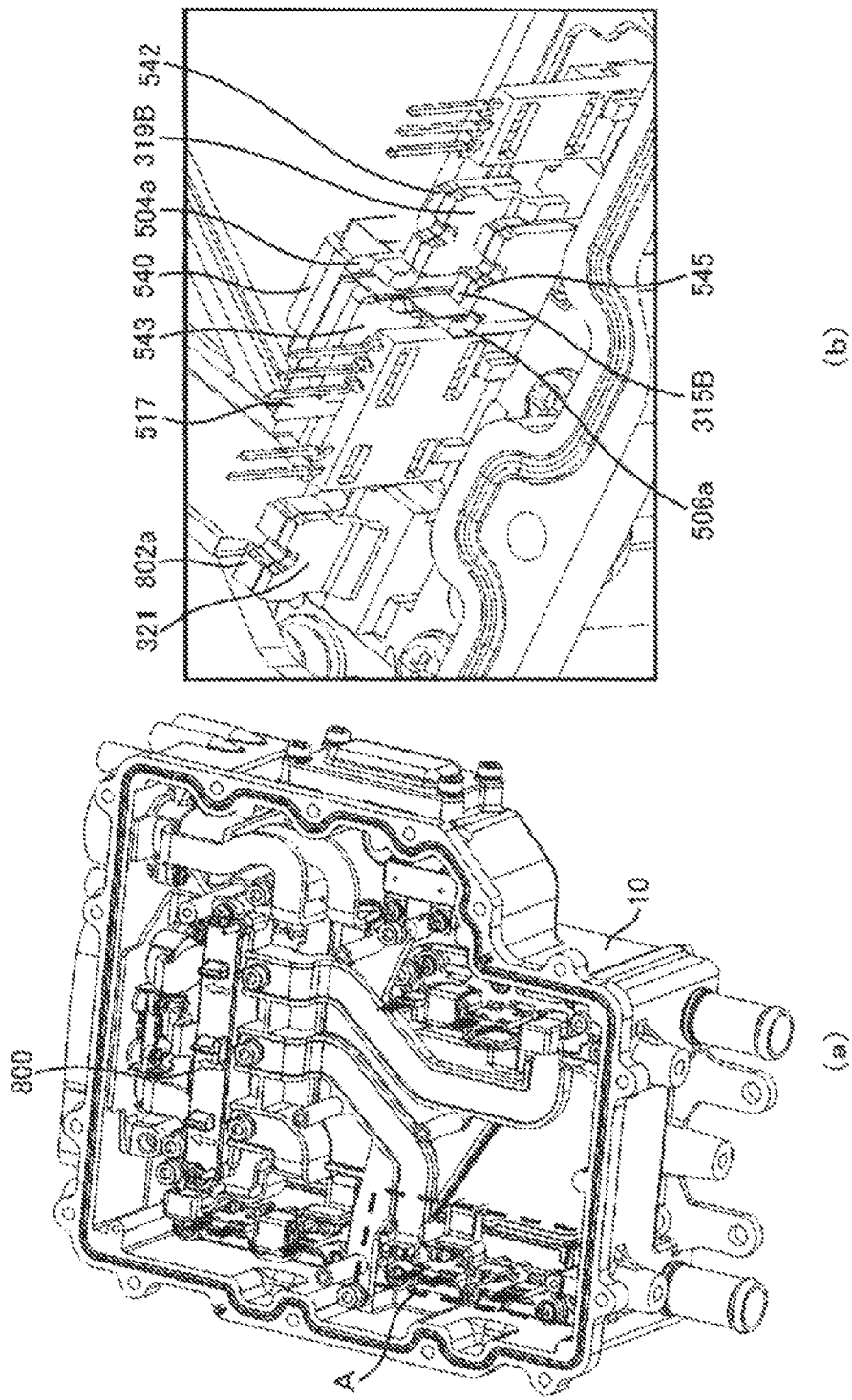
FIG. 12(*a*) is a perspective view of an appearance in which power semiconductor modules 300*a* to 300*c*, the capacitor module 500, and a bus bar assembly 800 are assembled to the case 10, and FIG. 12(*b*) is an enlarged view of a portion A of FIG. 12(*a*).

Further, as illustrated in FIGS. 4 and 12, a plurality of power semiconductor modules 300a and 300b is linearly arranged along aside of the longitudinal direction of the case 10. This can further improve the productivity when the plurality of power semiconductor modules 300a to 300b is welded.

Figure 13:
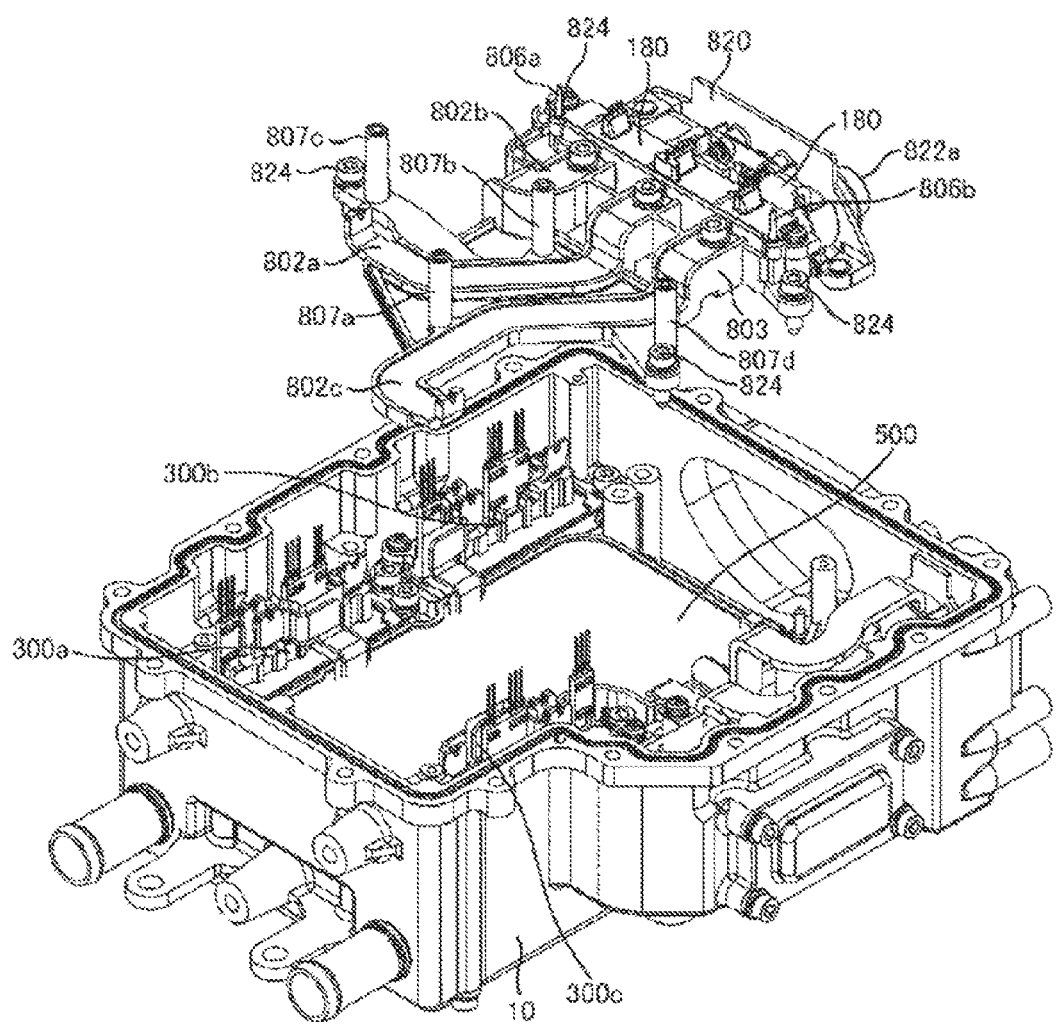
FIG. 13 is an exploded perspective view of the case 10 to which the power semiconductor modules 300*a* to 300*c* and the capacitor module 500 are assembled, and the bus bar assembly 800.
Figure 14:
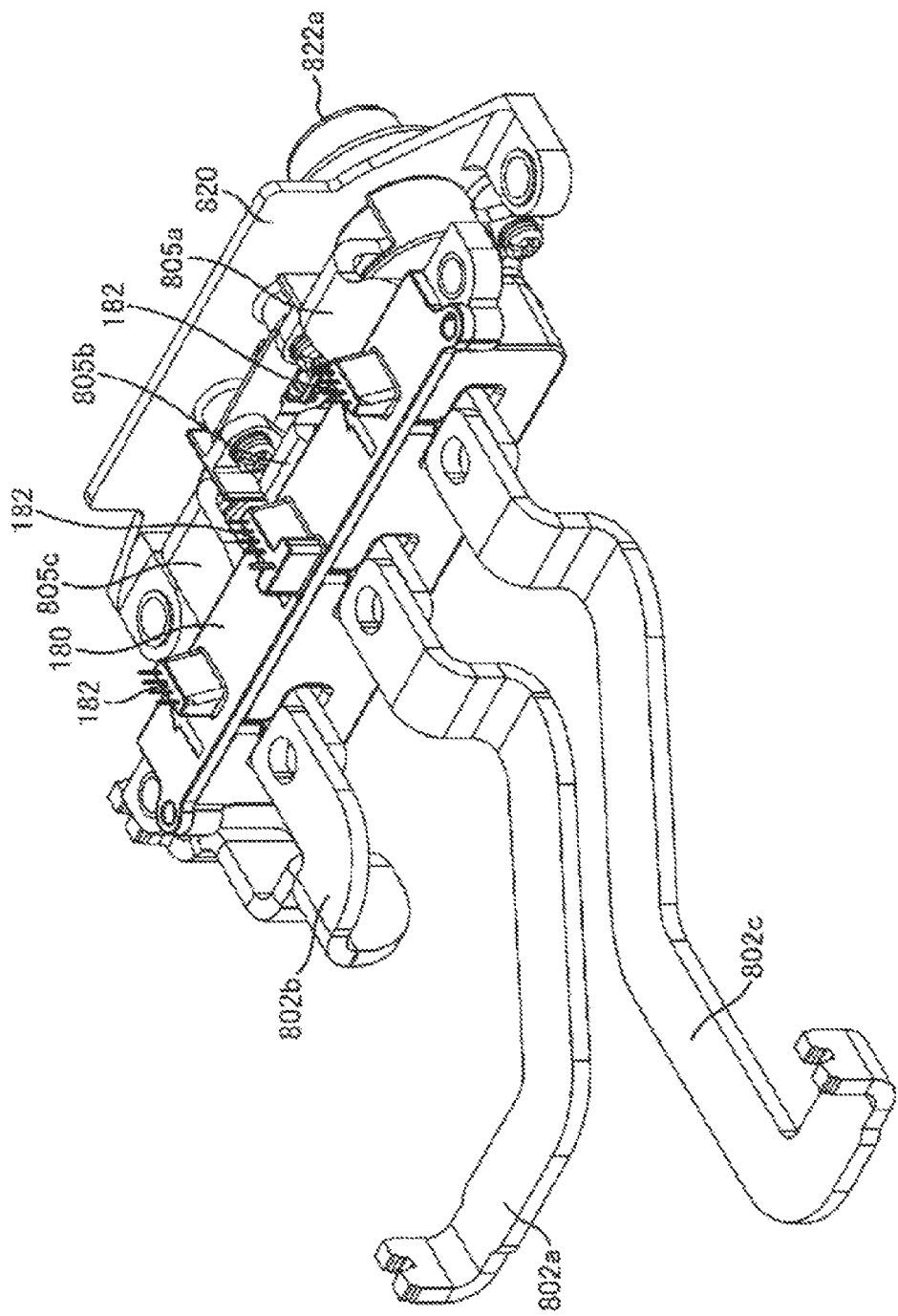
FIG. 14 is a perspective view of an appearance of the bus bar assembly 800 from which a holding member 803 is removed.

FIG. 13 is an exploded perspective view of the case 10 in which the power semiconductor modules 300a to 300c and the capacitor module 500 are assembled, and the bus bar assembly 800. FIG. 14 is a perspective view of an appearance of the bus bar assembly 800 from which the holding member 803 is removed.

As illustrated in FIGS. 13 and 14, the bus bar assembly 800 includes the AC bus bars 802a to 802c, and the holding member 803 for holding and fixing the AC bus bars 802a to 802c. Further, the bus bar assembly 800 includes the current sensor 180 for detecting an alternating current flowing in the AC bus bars 802a to 802c.

The AC bus bars 802a to 802c are bent in a direction away from the capacitor module 500 before through holes of the current sensor 180, and are connected with the AC bus bars 805a to 805c before holes of the current sensor 180. The AC bus bars 805a to 805c are respectively connected with the AC terminals 822a to 822c after passing through the hole of the current sensor 180.

As illustrated in FIG. 13, the AC bus bars 802a to 802c, the AC bus bars 805a to 805c, and the current sensor 180 are held and insulated by the holding member 803 made of resin.

The bus bar assembly 800 is fixed to the case 10 by the holding member 803. If heat is transmitted to the case 10 from an outside, an increase in temperature can be suppressed by the coolant flowing in the flow channel forming body 12. By fixing the bus bar assembly 800 to the case 10 having the flow channel forming body 12, an increase in temperature of the current sensor 180 held by the bus bar assembly 800 can be suppressed. The current sensor 180 has a characteristic of low heat resistance. With the structure, the reliability of the current sensor 180 can be improved.

As illustrated in FIG. 13, the holding member 803 includes supporting members 807a to 807d for supporting the driver circuit substrate 22 illustrated in FIG. 4. Screw holes for fixing the driver circuit substrate 22 are formed in tip sections of the supporting members 807a to 807d.

Further, the holding member 803 includes protrusion sections 806a and 806b extending upward from a portion where the current sensor 180 is arranged. The protrusion sections 806a and 806b pass through the current sensor. As illustrated in FIG. 14, the current sensor 180 includes signal lines 182 extending in a direction of the arrangement of the driver circuit substrate 22. The signal lines 182 are joined with a wiring pattern of the driver circuit substrate 22 by means of soldering. In the present embodiment, the holding member 803, the supporting members 807a to 807d, and the protrusion sections 806a to 806b are integrally formed by resin.

Accordingly, the holding member 803 has a function to position the current sensor 180 and the driver circuit substrate 22. Therefore, assembly and connection work by soldering between the signal lines 182 and the driver circuit substrate 22 becomes easy. In addition, by providing a mechanism to hold the current sensor 180 and the driver circuit substrate 22 in the holding member 803, the number of components of the electric power converter as a whole can be reduced. In the present embodiment, the electric power converter 200 is arranged in the vicinity of a vibration source such as an engine. Therefore, the holding member 803 reduces the influence of the vibration transferred to the driver circuit substrate 22 by including the supporting members 807a and 807b for supporting the vicinity of a center portion of the driver circuit substrate 22. For example, by supporting the center portion of the driver circuit substrate 22 by the supporting members 807a and 807b, the resonance frequency of the driver circuit substrate 22 can be increased compared with the frequency of the vibration transferred from the engine and the like, and influence of the vibration due to the engine and the like transferred to the driver circuit substrate 22 can be reduced.

Note that the holding member 803 of the bus bar assembly 800 is fixed to the case 10 with a screw 824.

Figure 15:
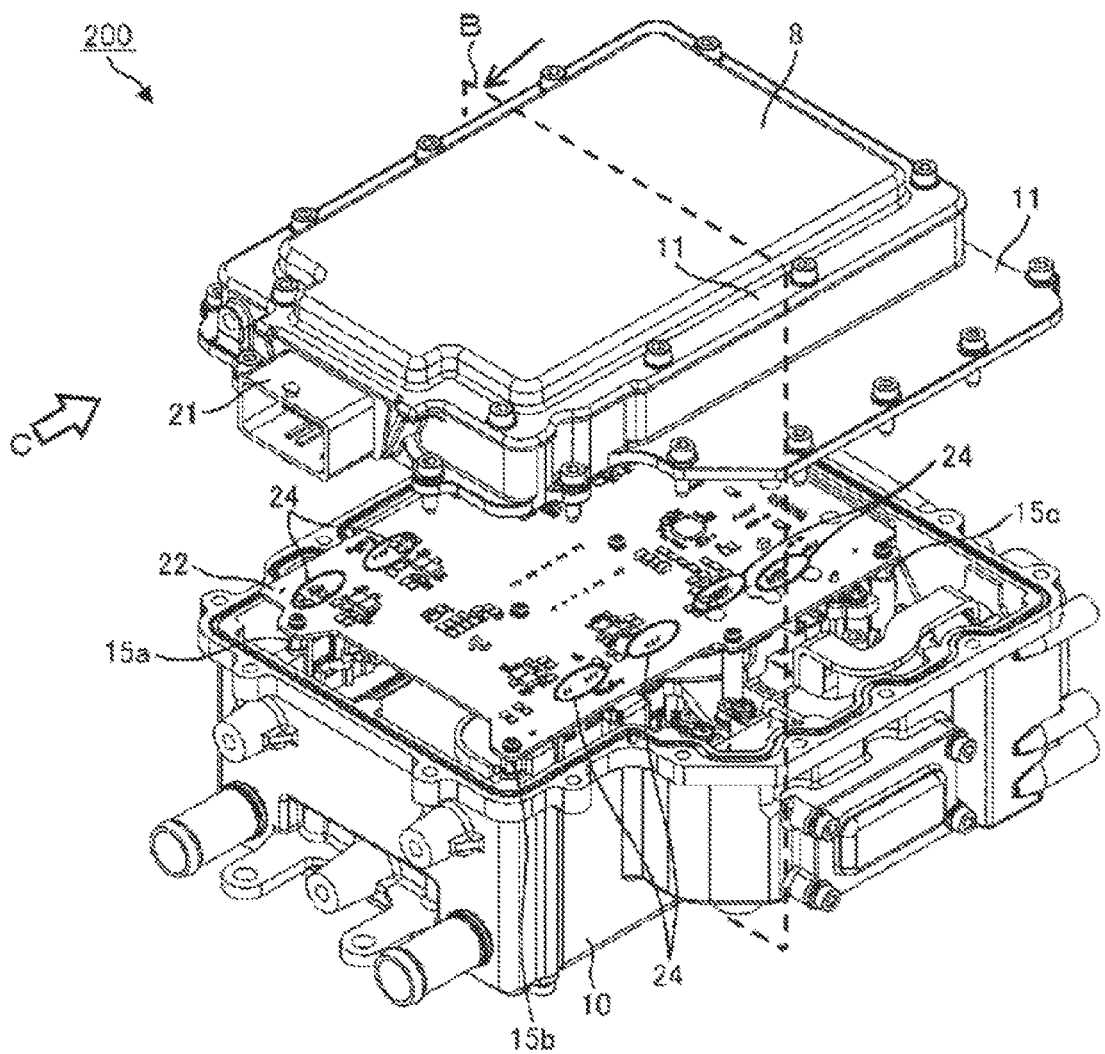
FIG. 15 is a perspective view of an electric power converter 200 in a state in which a metal base plate 11 is separated.
Figure 16:
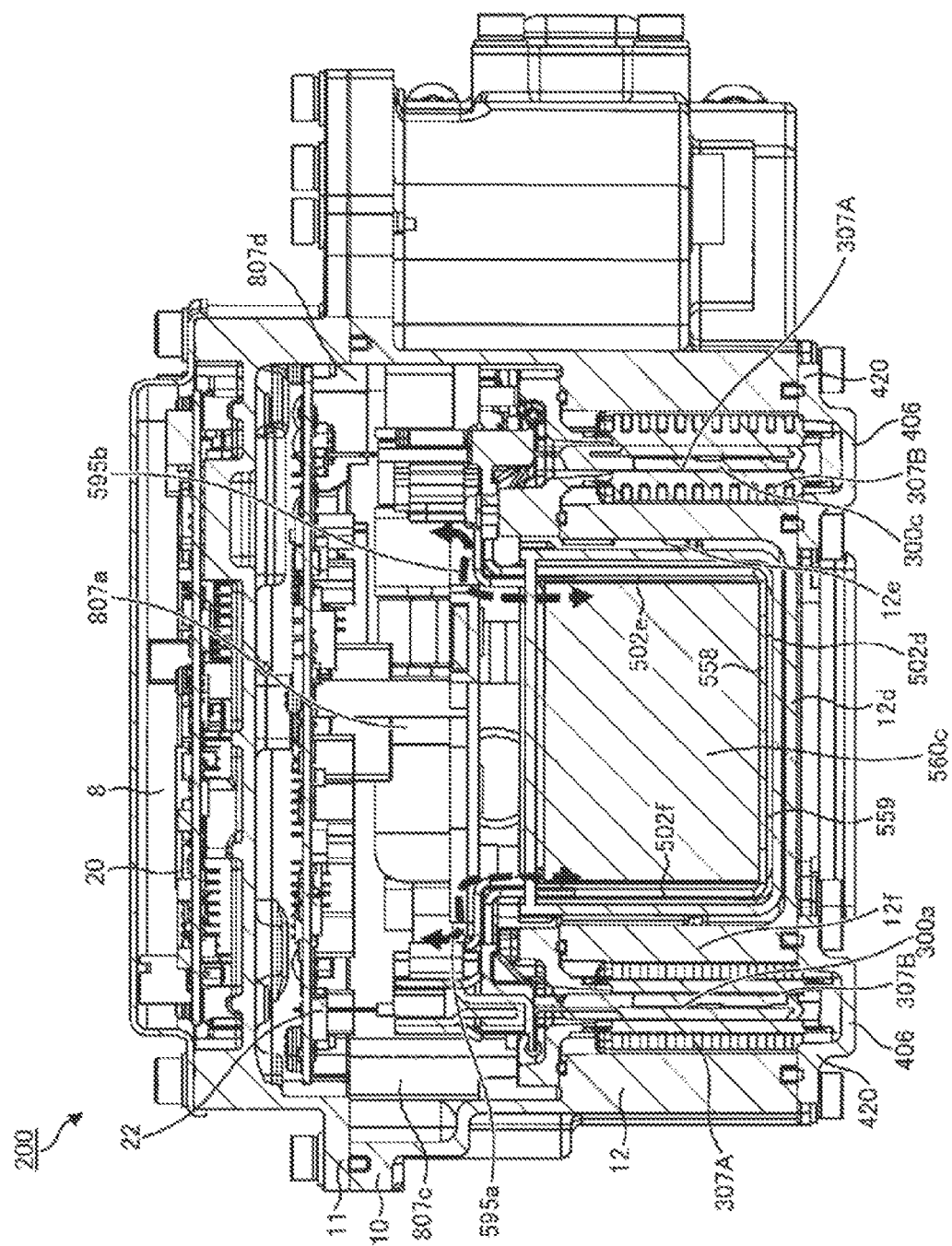
FIG. 16 is a cross sectional view of the electric power converter 200 as viewed from an arrow direction of a cross section B in FIG. 15.

FIG. 15 is a perspective view of the electric power converter 200 in a state in which the metal base plate 11 is separated. FIG. 16 is a cross sectional view of the electric power converter 200 when viewed from the arrow direction of the cross section B of FIG. 15.

As illustrated in FIG. 13, the current sensor 180 is arranged above the capacitor module 500. The driver circuit substrate 22 is arranged above the current sensor 180, and is further supported by the supporting members 807a to 807d provided in the bus bar assembly 800 illustrated in FIG. 14. Further, four corners of the driver circuit substrate 22 are connected to the case 10 via the supporting members 15a to 15d (15d is not illustrated).

The metal base plate 11 is arranged above the driver circuit substrate 22. In the present embodiment, a periphery of the opening of the case 10 is closed by the metal base plate 11. The control circuit substrate 20 is housed in a space formed by the metal base plate 11 and the cover 8.

The current sensor 180, the driver circuit substrate 22, and the control circuit substrate 20 are hierarchically arranged in the height direction, and the control circuit substrate 20 is arranged at a place farthest from the power semiconductor modules 300a to 300c of a high power system. Therefore, mixing of a switching noise and the like can be suppressed. Further, the metal base plate 11 is electrically connected to the flow channel forming body 12 electrically connected to the ground. The metal base plate 11 reduces the noise mixed in the control circuit substrate 20 from the driver circuit substrate 22.

It is desirable to prevent complication of connection processes and failure of connection when a wiring connector is used when the current sensor 180 and the driver circuit substrate 22 are electrically connected. In FIG. 15, a hole 24 passing through the driver circuit substrate 22 is formed in the driver circuit substrate 22. In addition, the signal terminal 325U and the signal terminal 325L of the power semiconductor modules 300a to 300c are inserted to the hole 24, and the signal terminal 325U and the signal terminal 325L are joined with the wiring pattern of the driver circuit substrate 22 by means of soldering. Note that the soldering is performed from a side of a surface of the driver circuit substrate 22 opposite to a surface facing the flow channel forming body 12.

Accordingly, the signal lines can be connected without using a wiring connector, whereby the productivity can be improved. Further, the signal terminals 325U and 325L of the power semiconductor module 300 and the signal lines 182 of the current sensor 180 are joined in the same direction by means of soldering, whereby the productivity can be further improved.

In addition, the driver circuit substrate 22 of the present embodiment implements a drive circuit (not illustrated) such as a driver IC chip on a surface side facing the flow channel forming body 12. This suppresses transference of heat to the driver IC chip and the like due to soldering, and prevents damage to the driver IC chip and the like due to soldering. In addition, a toll component such as a transformer mounted on the driver circuit substrate 22 is arranged in a space between the capacitor module 500 and the driver circuit substrate 22. Therefore, the electric power converter 200 as a whole can be made short.

Figure 17:
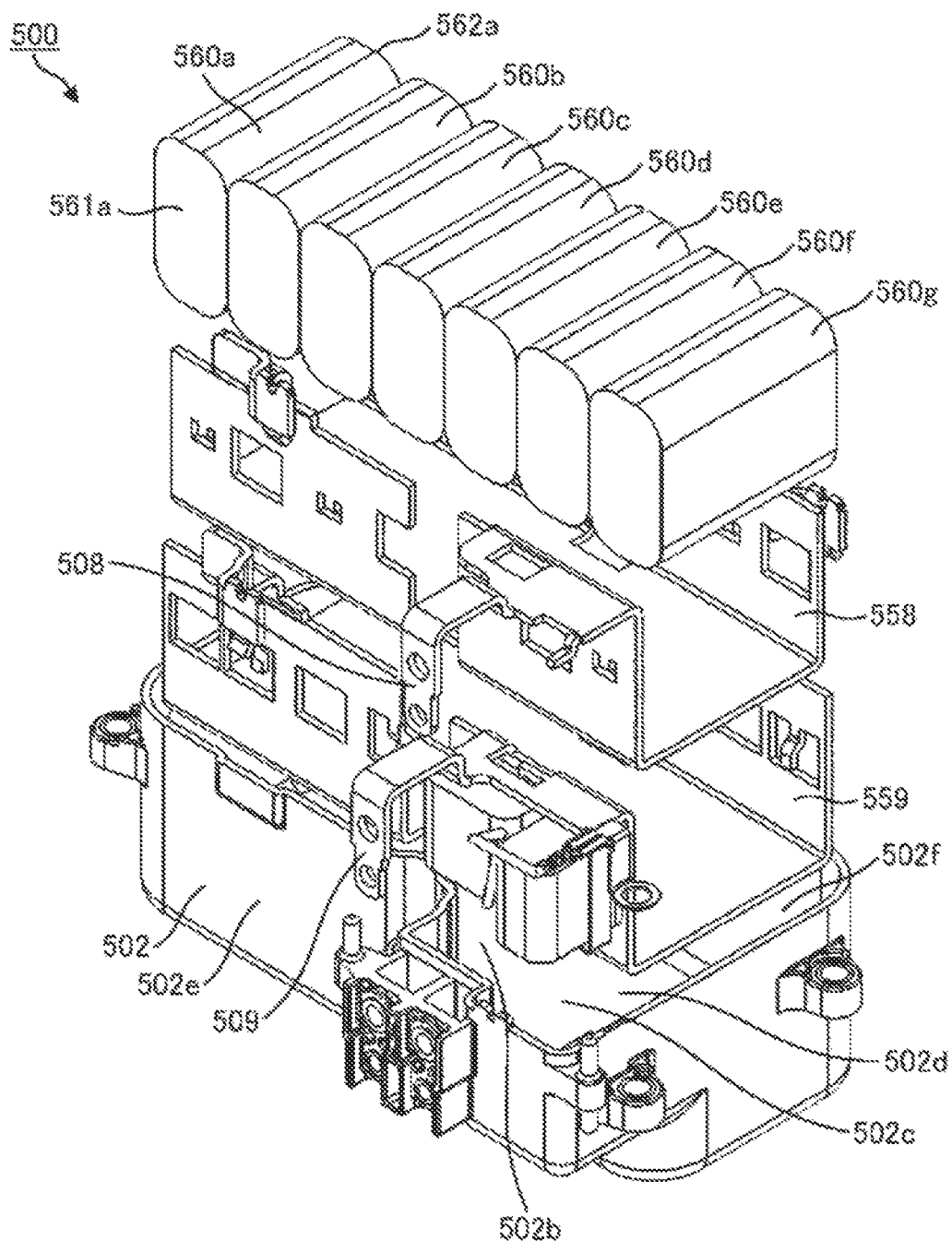
FIG. 17 is an exploded perspective view of the capacitor module 500 illustrated in FIG. 11, from which a resin seal material 550 is removed.

FIG. 17 is an exploded perspective view of the capacitor module 500 illustrated in FIG. 11, from which the resin seal material 550 is removed. In the present embodiment, a plurality of smoothing capacitor elements 560a to 560g is arranged in series along the longitudinal direction of the capacitor case 502. However, the number of the smoothing capacitor elements may be only one.

The capacitor case 502 has an approximately rectangular shape and forms an opening 502b in one surface and includes the capacitor elements 560a to 560g and the space 502c for housing the negative conductor plate 558 and the positive conductor plate 559. In a state where the capacitor elements 560a to 560g, the negative conductor plate 558, and the positive conductor plate 559 are housed in the capacitor case 502, the negative conductor plate 558 and the positive conductor plate 559 are arranged between inner wall surfaces of the capacitor elements 560a to 560g and the capacitor case 502 and along a bottom surface 502d, a first side surface 502e, and a second side surface 502f of the capacitor case 502.

As illustrated in FIG. 16, the capacitor module 500 described with reference to FIG. 17 is arranged in the space for housing 405 formed by the flow channel forming body 12. Accordingly, the bottom surface 502d, the first side surface 502e, and the second side surface 502f of the capacitor case 502 face the flow channel forming body 12 forming the space 405. To be specific, the bottom surface 502d of the capacitor case 502 faces the flow channel forming body 12d, the first side surface 502e of the capacitor case 502 faces the flow channel forming body 12e, and the second side surface 502f of the capacitor case 502 faces the flow channel forming body 12f. Note that, in the present embodiment, the flow channel forming body 12d is a member for integrally connecting the flow channel forming body 12e and the flow channel forming body 12f, and heat generated from the bottom surface 502d of the capacitor case 502 is transferred to the flow channel forming body 12e and the flow channel forming body 12f through the flow channel forming body 12d. A flow channel for allowing a coolant to flow can be formed in the flow channel forming body 12d, similarly to the flow channel forming body 12e and the flow channel forming body 12f. Accordingly, the negative conductor plate 558 and the positive conductor plate 559 are cooled by the flow channel forming bodies 12d to 12f that are cooling bodies, whereby the cooling performance of the capacitor module 500 can be improved.

Further, it is desirable that the capacitor case 502 and the flow channel forming bodies 12d to 12f sandwich a thermal conductive member having relatively high thermal conductance and flexibility. As such a thermal conductive member, a thermal conductive sheet, thermal conductive grease, or silicone rubber having high thermal conductance can be applied. To apply a thermal conductive sheet, it is necessary to reduce a gap between the thermal conductive sheet and the capacitor case 502, and the flow channel forming bodies 12d to 12f. When the flow channel forming bodies 12d to 12f are formed by die casting, the shape of the space 405 for housing the capacitor module 500 is typically a trapezoid due to a draft of a mold. Therefore, it is desirable to form the capacitor case 502 into a shape according to the draft. When high thermal conductive silicone rubber is filled, on the other hand, it is difficult to fill the rubber into the gap between members. Therefore, when capacitor module 500 is arranged in the space for housing 405, the rubber is poured in the space for housing 405, first, and the capacitor module 500 is then pushed therein so that the rubber is filled in the gap, whereby the rubber can be spread without any gap.

Further, as illustrated in FIG. 16, the power semiconductor module 300a is arranged such that the first dissipation surface 307A and the second dissipation surface 307B face the flow channel forming body 12f. This enables the flow channel formed in the flow channel forming body 12f to cool not only the negative conductor plate 558 and the positive conductor plate 559 but also to cool the power semiconductor module 300a, whereby the main circuit of the electric power converter, which is made of the capacitor module 500 and the power semiconductor module 300a, can be implemented in a compact manner. Especially, the power semiconductor module 300a faces the flow channel forming body 12f and the power semiconductor module 300c faces the flow channel forming body 12e. Therefore, balance of the heat generated from the both of the first side surface 502e and the second side surface 502f of the capacitor case 502 is maintained, and the capacitor elements 560a to 560g can be protected from the heat.

Further, as illustrated in FIG. 17, the capacitor element 560a is a wound-type cylindrical film capacitor element in which the electrode surface 561a and the electrode surface 562a face each other. The capacitor elements 560b to 560g have similar structures to the capacitor element 560a. Heat generated in the wound-type film capacitor element is transferred from a center portion of the film capacitor element to the electrode surface 561a and the electrode surface 562a. Therefore, the capacitor element 560a according to the present embodiment is arranged such that the electrode surface 561a and the electrode surface 562a face both of the first side surface 502e and the second side surface 502f of the capacitor case 502. Accordingly, the heat from the capacitor elements 560a to 560g can be efficiently transferred to the flow channel forming bodies 12e and 12f.

Here, return currents 595a and 595b illustrated in FIG. 16 will be described with reference to the drawing. FIG. 18 is a schematic view of the inverter circuit. When the U phase upper arm IGBT is ON (the lower arm is always OFF), the V phase lower arm is OFF (the upper arm is always OFF), and the W phase lower arm is ON (the upper arm is always OFF), the current flows as indicated by the arrows in FIG. 18. At this time, the current flowing in the V phase does not return to the battery side and flows toward the U phase upper arm IGBT having low impedance. This current is the return currents 595a and 595b flowing between phases, and the return currents 595a and 595b does not flow between the upper and lower arms and flows only between the upper arms or only between the lower arms. As described in the present embodiment, even if the power semiconductor module is configured to be separated for each phase, and the return currents 595a and 595b flow in the capacitor case 502 via the negative conductor plate 558 and the positive conductor plate 559, influence of heat due to the return currents 595a and 595b can be reduced by cooling the negative conductor plate 558 and the positive conductor plate 559 like the present embodiment.

Embodiment 2

Figure 19:
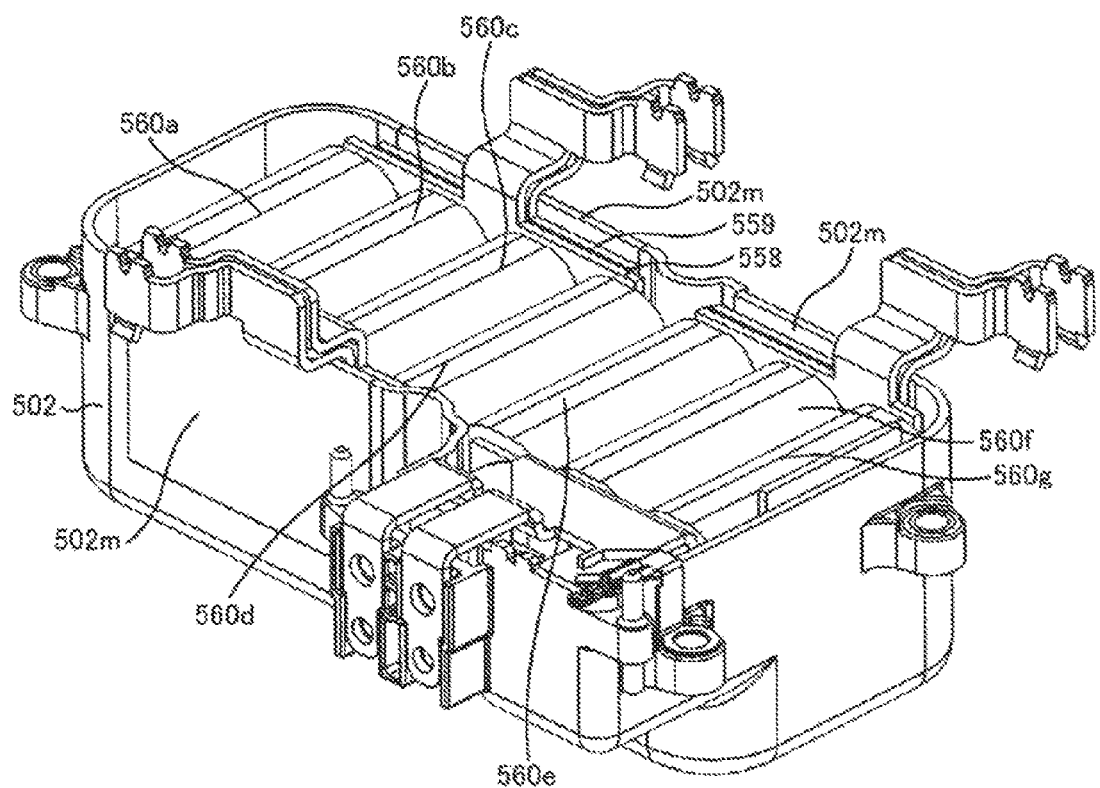
FIG. 19 is a perspective view of a capacitor module according to another embodiment.

FIG. 19 illustrates a perspective view of a capacitor module according to another embodiment. Configurations denoted with the same reference numbers as Embodiment 1 have similar functions to Embodiment 1. A plate-like metal member 502m is fitted into a part of a capacitor case 502. The plate-like metal member 502m is desirably made of aluminum because of lightweight and high heat transfer properties. However, other metal members can be employed as long as they have high heat transfer properties. Other portions that support the plate-like member 502m of the capacitor case 502 is formed of a resin member. The plate-like member 502m is arranged at a position facing the negative conductor plate 558 or the positive conductor plate 559. This further enhances heat dissipation of the negative conductor plate 558 or the positive conductor plate 559. However, aluminum has conductivity. Therefore, it is necessary to have a structure for insulation, such as to sandwich an insulating paper between the negative conductor plate 558 or the positive conductor plate 559 and the plate-like member 502m.

In the above embodiment, the negative conductor plate 558 and the positive conductor plate 559 are formed by processing a wide-width conductor plate as illustrated in FIG. 17. That is, the wide-width surfaces of the negative conductor plate 558 and the positive conductor plate 559, the surfaces having a certain area, are formed to face a flow channel forming body 12d, a flow channel forming body 12e, and a flow channel forming body 12f. However, the negative conductor plate 558 and the positive conductor plate 559 are not necessarily formed of a wide-width conductor plate. A long and narrow bus bar may be used. In that case, the negative conductor plate 558 and the positive conductor plate 559 are formed to have a space 502c for housing capacitor elements 560a to 560g. In a state where the capacitor elements 560a to 560g, the negative conductor plate 558, and the positive conductor plate 559 are housed in the capacitor case 502, the negative conductor plate 558 and the positive conductor plate 559 are arranged between the capacitor elements 560a to 560g and inner wall surfaces of the capacitor case 502, and along a bottom surface 502d, a first side surface 502e, and a second side surface 502f of the capacitor case 502. Accordingly, the negative conductor plate 558 and the positive conductor plate 559 are not necessarily formed such that wide-width surfaces face the flow channel forming body 12d, the flow channel forming body 12e, and the flow channel forming body 12f, but are formed such that surfaces of the bus bars having a certain area face the flow channel forming body 12d, the flow channel forming body 12e, and the flow channel forming body 12f, whereby certain efficient cooling effect can be obtained.

While various embodiments and modification have been described, the present invention is not limited contents thereof. Other embodiments are also included in the scope of the present invention, which can be considered within the scope of the technical ideas of the present invention.

Disclosed contents of the following earlier application given as the basis of the priority are incorporated herein as a citation.

Japanese Patent Application No. 2011-123907 (filed on Jun. 2, 2011)

The invention claimed is:

1. An electric power converter comprising:
   a power semiconductor module including a power semiconductor element that converts a direct current into an alternating current;
   a capacitor module including a capacitor element that smooths the direct current; and
   a cooling body configured to cool the power semiconductor module and the capacitor module,
   wherein the capacitor module includes a case having an approximately rectangular shape, forming an opening in one surface, and including a space for housing the capacitor element, and a DC conductor for electrically connecting the power semiconductor element and the capacitor element,
   the cooling body is formed to face a bottom surface of an inner wall of the case, and both side surfaces of the case, the side surfaces facing each other, and
   the DC conductor is formed between the capacitor element and the cooling body, between the capacitor element and the inner wall surface of the case, and along the bottom surface and the both side surfaces of the case.

2. The electric power converter according to claim 1, wherein
   the cooling body includes a first flow channel forming body that allows a coolant to flow and is arranged at a side portion of one side surface of the both end surfaces of the case, and
   the power semiconductor module is fixed to the first flow channel forming body such that a dissipation surface of the power semiconductor module faces the one side surface of the both side surfaces of the case.

3. The electric power converter according to claim 1, wherein
   the cooling body includes a first flow channel forming body that allows a coolant to flow and is arranged at a side portion of one of the both side surfaces of the case, and a second flow channel forming body that allows a coolant to flow and is arranged at a side portion of the other of the both side surfaces of the case,
   a plurality of power semiconductor modules is provided, and
   the plurality of the power semiconductor modules is further arranged by being separated into the first flow channel forming body and to the second flow channel forming body.

4. The electric power converter according to claim 1, wherein
   the capacitor element is a wound-type cylindrical film capacitor element in which two electrode surfaces face each other, and
   the film capacitor element is arranged such that the two electrode surfaces face the both side surfaces.

5. The electric power converter according to claim 1, wherein
   the DC conductor is configured from a positive electrode-side conductor, a negative electrode-side conductor, and an insulating member arranged between the positive electrode-side conductor and the negative electrode-side conductor, and
   at least parts of the positive electrode-side conductor and of the negative electrode-side conductor are in a layered state in the space of the case.

6. The electric power converter according to claim 1, wherein
   the bottom surface or the side surfaces facing the DC conductor in the case is made of a metal member, and the other parts are made of a resin member.

7. The electric power converter according to claim 1,
   the electric power converter outputs a three phase alternating current including a U phase, a V phase, and a W phase, wherein
   a plurality of the power modules are provided by being separated into a U phase power module that outputs a U phase, a V phase power module that outputs a V phase, and a W phase power module that outputs W phase,
   a DC terminal of the U phase power module is directly connected with the DC conductor,
   a DC terminal of the V phase power module is directly connected with the DC conductor, and
   a DC terminal of the W phase power module is directly connected with the DC conductor.

8. The electric power converter according to claim 1, wherein
   the DC conductor is configured from a conductor plate.

* * * * *